United States Patent
Kim et al.

(10) Patent No.: US 12,302,722 B2
(45) Date of Patent: *May 13, 2025

(54) DISPLAY PANEL AND ELECTRONIC APPARATUS INCLUDING THE SAME

(71) Applicant: SAMSUNG DISPLAY CO., LTD., Yongin-si (KR)

(72) Inventors: Jongseok Kim, Yongin-si (KR); Kiyoung Kim, Yongin-si (KR); Minjeong Park, Yongin-si (KR); Jinseok Oh, Yongin-si (KR); Yeji Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/537,612

(22) Filed: Dec. 12, 2023

(65) Prior Publication Data

US 2024/0130186 A1 Apr. 18, 2024

Related U.S. Application Data

(63) Continuation of application No. 17/474,418, filed on Sep. 14, 2021, now Pat. No. 11,895,881.

(30) Foreign Application Priority Data

Jan. 27, 2021 (KR) .......................... 10-2021-0011799

(51) Int. Cl.
*H10K 59/131* (2023.01)
*H10K 59/35* (2023.01)

(52) U.S. Cl.
CPC ......... *H10K 59/131* (2023.02); *H10K 59/353* (2023.02)

(58) Field of Classification Search
CPC ........................... H10K 59/131; H10K 59/353
See application file for complete search history.

(56) References Cited

U.S. PATENT DOCUMENTS 10,756,136 B1 8/2020 Ma et al.
11,895,881 B2 * 2/2024 Kim ..................... H10K 59/353
(Continued)

FOREIGN PATENT DOCUMENTS

CN 111916486 A 11/2020
EP 3660910 A1 6/2020
(Continued)

*Primary Examiner* — Douglas M Menz
(74) *Attorney, Agent, or Firm* — CANTOR COLBURN LLP

(57) ABSTRACT

A display panel includes a substrate on which a first display area and a second display area are defined, where the second display area is at least partially surrounded by the first display area and including a sub display and transmission areas, first display devices on the substrate in the first display area, second display devices on the substrate in the sub display area, a first scan line extending from the first display area into the second display area across one side of the second display area, a first sub scan line in the second display area and including a first end facing the first scan line, a first bridge line electrically connecting the first scan line to the first sub scan line, and a bottom metal layer disposed between the second display devices and the substrate in the second display area. The bottom metal layer does not overlap the first scan line when viewed from a direction perpendicular to the substrate.

20 Claims, 19 Drawing Sheets

(56) References Cited

U.S. PATENT DOCUMENTS

| 2020/0135972 | A1 | 4/2020 | Ma et al. |
| 2021/0005154 | A1 | 1/2021 | Kim et al. |
| 2022/0045160 | A1 | 2/2022 | Lee et al. |
| 2022/0069047 | A1 | 3/2022 | Yang et al. |

FOREIGN PATENT DOCUMENTS

| KR | 1020180074905 A | 7/2018 |
| KR | 1020200017787 A | 2/2020 |

* cited by examiner

DISPLAY PANEL AND ELECTRONIC APPARATUS INCLUDING THE SAME

This application is a continuation of U.S. patent application Ser. No. 17/474,418, filed on Sep. 14, 2021, which claims priority to Korean Patent Application No. 10-2021-0011799, filed on Jan. 27, 2021, and all the benefits accruing therefrom under 35 U.S.C. § 119, the content of which in its entirety is herein incorporated by reference.

BACKGROUND

1. Field

One or more embodiments relate to a display panel and an electronic apparatus including the display panel, and more particularly, to a display panel in which a pixel defect in a display area is effectively prevented or minimized, and an electronic apparatus including the display panel.

2. Description of the Related Art

Display panels are widely used in various fields. An electronic apparatus may include such a display panel to increase user convenience. Such a display panel may include a display area and a non-display area, and may be desired to improve user convenience by increasing the area occupied by the display area. Accordingly, a display panel including an area for implementing various functions as well as an image display function in a display area has been proposed.

SUMMARY

In a display panel including an area for implementing various functions in a display area and an electronic apparatus including such a display panel, a defective pixel may occur in a display area.

Accordingly, one or more embodiments relate to a display panel in which a pixel defect in a display area is effectively prevented or minimized, and an electronic apparatus including the display panel.

According to one or more embodiments, a display panel includes a substrate on which a first display area and a second display area are defined, where the second display area is at least partially surrounded by the first display area and includes a sub display area and a transmission area, first display devices disposed on the substrate in the first display area, second display devices disposed on the substrate in the sub display area of the second display area, a first scan line extending from the first display area into the second display area across one side of the second display area, a first sub scan line disposed in the second display area and having a first end facing the first scan line, a first bridge line electrically connecting the first scan line to the first sub scan line, and a bottom metal layer disposed between the second display devices and the substrate in the second display area, where the bottom metal layer does not overlap the first scan line when viewed from a direction perpendicular to the substrate.

In an embodiment, when viewed from the direction perpendicular to the substrate, the bottom metal layer may overlap a portion of the first bridge line where the first end of the first sub scan line and the first bridge line overlap each other.

In an embodiment, when viewed from the direction perpendicular to the substrate, the bottom metal layer may include a first indent portion indented inward, and the first scan line and the first bridge line may contact each other in the first indent portion.

In an embodiment, a distance between the first scan line and the substrate and a distance between the first sub scan line and the substrate may be less than a distance between the first bridge line and the substrate.

In an embodiment, when viewed from the direction perpendicular to the substrate, the first scan line may pass some of the first display devices and the first sub scan line may pass the second display devices.

In an embodiment, the display panel may further include a second scan line extending from the first display area into the second display area across another side of the second display area, and a second bridge line electrically connecting the second scan line to the first sub scan line, where a second end of the first sub scan line may face the second scan line, and the bottom metal layer may not overlap the second scan line when viewed from the direction perpendicular to the substrate.

In an embodiment, when viewed from the direction perpendicular to the substrate, the bottom metal layer may overlap a portion of the second bridge line where the second end of the first sub scan line and the second bridge line overlap each other.

In an embodiment, when viewed from the direction perpendicular to the substrate, the bottom metal layer may include a second indent portion indented inward and the second scan line and the second bridge line may contact each other in the second indent portion.

In an embodiment, a distance between the second scan line and the substrate may be less than a distance between the second bridge line and the substrate.

In an embodiment, when viewed from the direction perpendicular to the substrate, the first scan line may pass some of the first display devices, the second scan line may pass some others of the first display devices, and the first sub scan line may pass the second display devices.

In an embodiment, the display panel may further include a third scan line extending from the first display area into the second display area across the one side of the second display area, a second sub scan line disposed in the second display area and having a third end facing the third scan line, and a third bridge line electrically connecting the third scan line to the second sub scan line, where the bottom metal layer may not overlap the third scan line when viewed from the direction perpendicular to the substrate.

In an embodiment, when viewed from the direction perpendicular to the substrate, the bottom metal layer may overlap a portion of the third bridge line where the third end of the second sub scan line and the third bridge line overlap each other.

In an embodiment, when viewed from the direction perpendicular to the substrate, the bottom metal layer may include a third indent portion indented inward and the third scan line and the third bridge line may contact each other in the third indent portion.

In an embodiment, a distance between the third scan line and the substrate and a distance between the second sub scan line and the substrate may be less than a distance between the third bridge line and the substrate.

In an embodiment, the first sub scan line may overlap the bottom metal layer when viewed from the direction perpendicular to the substrate.

In an embodiment, the first scan line and the first sub scan line may be disposed in a same layer as each other.

In an embodiment, the second display devices may share an opposite electrode which is integrally formed as a single body, where a first opening portion may be defined through the opposite electrode to correspond to the transmission area, and a second opening portion is may be defined through the bottom metal layer to overlap the first opening portion of the opposite electrode when viewed from the direction perpendicular to the substrate.

In an embodiment, the display panel may further include an additional bottom metal layer disposed between the first display device and the substrate in the first display area, where a thickness of the bottom metal layer may be greater than a thickness of the additional bottom metal layer.

In an embodiment, a distance between the bottom metal layer and the substrate may be greater than a distance between the additional bottom metal layer and the substrate.

According to one or more embodiments, an electronic apparatus includes a display panel including a first display area and a second display area, where the second display area is at least partially surrounded by the first display area and includes a sub display area and a transmission area, and a component disposed under the display panel to overlap the second display area. In such embodiments, the display panel includes first display devices disposed in the first display area, second display devices disposed in the sub display area of the second display area, a first scan line extending from the first display area into the second display area across one side of the second display area, a first sub scan line disposed in the second display area and including a first end facing the first scan line, a first bridge line electrically connecting the first scan line to the first sub scan line, and a bottom metal layer disposed between the second display devices and a substrate of the display panel in the second display area, where the bottom metal layer does not overlap the first scan line when viewed from a direction perpendicular to the substrate.

BRIEF DESCRIPTION OF THE DRAWINGS

The above and other features of embodiments of the invention will be more apparent from the following description taken in conjunction with the accompanying drawings, in which.

DETAILED DESCRIPTION

Figure 1:
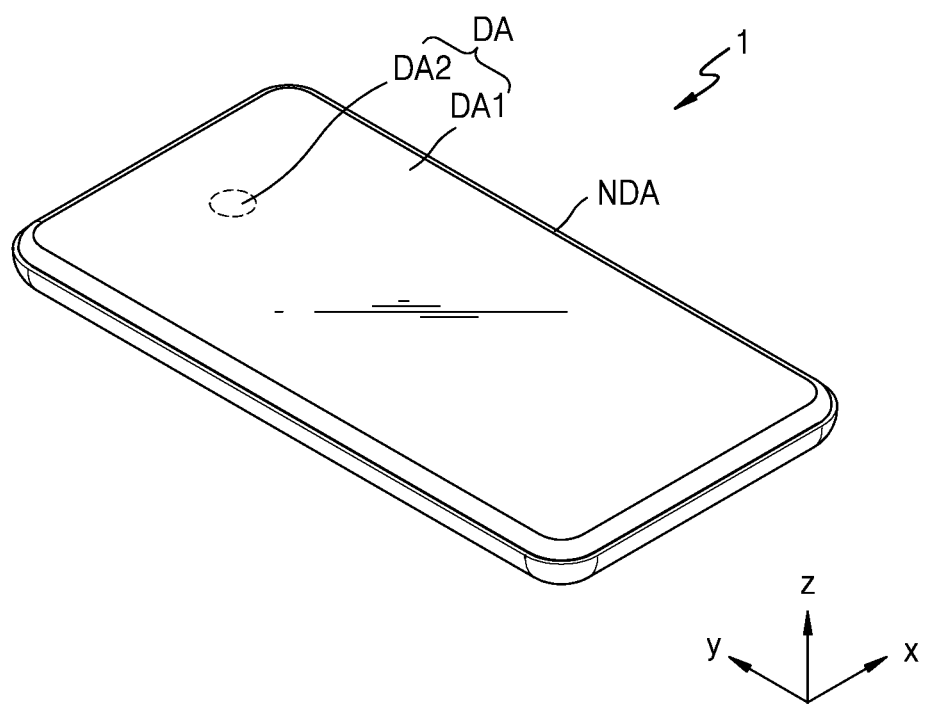
FIG. 1 is a perspective view schematically illustrating a display panel and an electronic apparatus including the display panel according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. It will be further understood that the terms "comprises"

and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings, and in the following description, like reference numerals will denote like elements throughout, and any repetitive detailed descriptions thereof will be omitted or simplified for conciseness.

FIG. 1 is a perspective view schematically illustrating a display panel and an electronic apparatus 1 including the display panel according to an embodiment. In an embodiment, the electronic apparatus 1 may be an apparatus for displaying a moving image or a still image and may be or may be a portion of various products such as televisions, laptop computers, monitors, billboards, and Internet of Things ("IoT") apparatus as well as portable electronic apparatuses such as mobile phones, smart phones, tablet personal computers ("PC"s), mobile communication terminals, electronic notebooks, electronic books, portable multimedia players ("PMP"s), navigations, and Ultra Mobile PCs ("UMPC"s). In an embodiment, the electronic apparatus 1 may be or may be a portion of a wearable device such as a smart watch, a watch phone, a glasses-type display, or a head-mounted display ("HMD"). However, the disclosure is not limited thereto. In one alternative embodiment, for example, the electronic apparatus 1 may be a center information display ("CID") arranged at a vehicle's instrument panel or a vehicle's center fascia or dashboard, a room mirror display replacing a vehicle's side mirror, an entertainment display for a vehicle's rear seat, or a display arranged at a rear side of a vehicle's front seat. For convenience of description, FIG. 1 illustrates an embodiment where the electronic apparatus 1 is a smart phone.

In an embodiment, as illustrated in FIG. 1, the electronic apparatus 1 may include a display area DA and a non-display area NDA outside the display area DA. The electronic apparatus 1 may display an image through an array of a plurality of pixels two-dimensionally arranged in the display area DA.

The non-display area NDA may be an area in which no image is displayed and may entirely surround the display area DA. A driver or the like for providing an electric signal or power to display devices arranged in the display area DA may be arranged in the non-display area NDA. A pad, which is an area to which an electronic device, a printed circuit board, or the like may be electrically connected, may be arranged in the non-display area NDA.

The display area DA may include a first display area DA1 and a second display area DA2. The second display area DA2 may be an area in which a component for adding various functions to the electronic apparatus 1 is arranged, and the second display area DA2 may also be referred to as a component area.

FIG. 1 illustrates an embodiment where the second display area DA2 is entirely surrounded by the first display area DA1, but the disclosure is not limited thereto. In one alternative embodiment, for example, the second display area DA2 may be partially surrounded by the first display area DA1 as illustrated in FIG. 2 that is a plan view schematically illustrating a display panel and an electronic apparatus 1 including the display panel according to an alternative embodiment.

Figure 2:
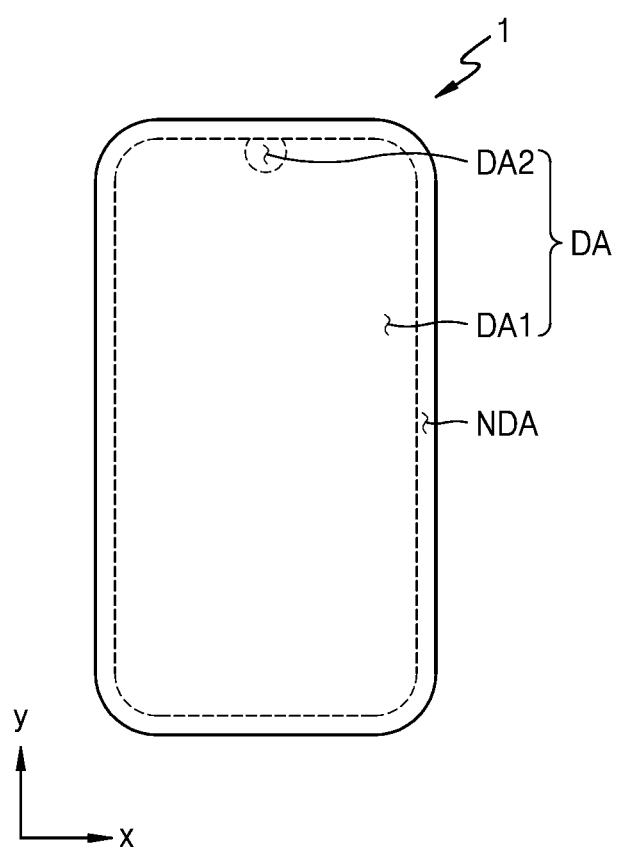
FIG. 2 is a plan view schematically illustrating a display panel and an electronic apparatus including the display panel according to another embodiment.
Figure 3:
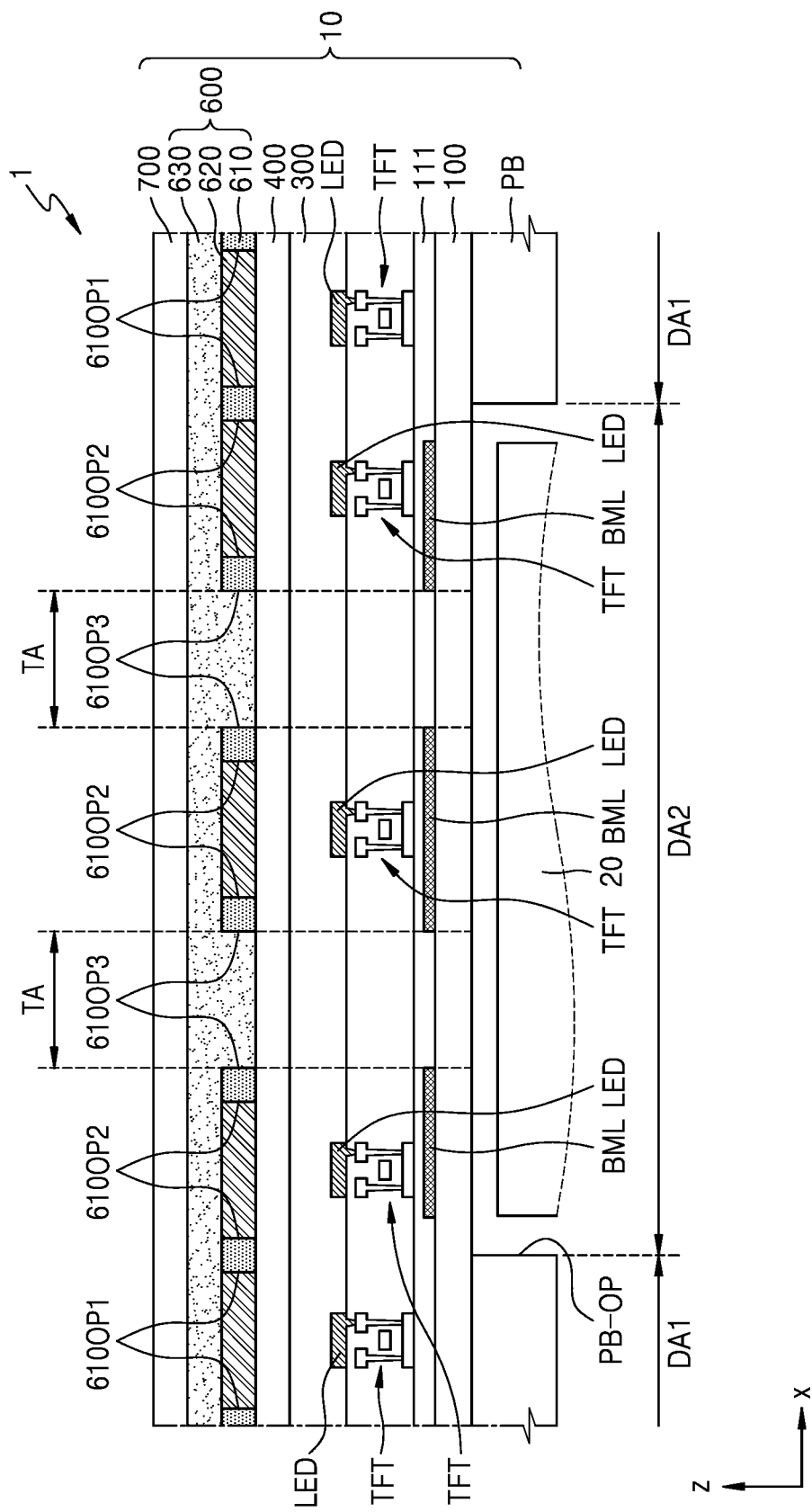
FIG. 3 is a cross-sectional view schematically illustrating a portion of the display panel and the electronic apparatus including the display panel illustrated in FIG. 1 or 2.

FIG. 3 is a cross-sectional view schematically illustrating a portion of a display panel 10 and an electronic apparatus 1 including the display panel 10 illustrated in FIG. 1 or 2. In an embodiment, as illustrated in FIG. 3, the electronic apparatus 1 may include a display panel 10 and a component 20 arranged (or disposed) under the display panel 10 to overlap the display panel 10. The component 20 may be located in or to overlap the second display area DA2.

The display panel 10 may include a substrate 100, a thin film transistor TFT arranged over the substrate 100, a display device (such as a light-emitting diode LED) electrically connected to the thin film transistor TFT, an encapsulation layer 300 covering the display device, an input sensing layer 400, an anti-reflection layer 600, and a window 700.

The substrate 100 may include glass, metal, and/or polymer resin. In an embodiment, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

However, the substrate 100 may be variously modified, e.g., to have a multilayer structure including two layers including the polymer resin and a barrier layer disposed between the two layers and including an inorganic material (e.g., silicon oxide, silicon nitride, and/or silicon oxynitride). The substrate 100 including the polymer resin may be flexible, foldable, rollable, or bendable.

A lower protection film PB may be arranged on the lower surface of the substrate 100. The lower protection film PB may be attached to the lower surface of the substrate 100. In an embodiment, an adhesive layer may be arranged between the lower protection film PB and the substrate 100. Alternatively, the lower protection film PB may be formed directly on the lower surface of the substrate 100, and in such an embodiment, an adhesive layer may not be arranged between the lower protection film PB and the substrate 100.

The lower protection film PB may support and protect the substrate 100. In an embodiment, an opening PB-OP may be defined through the lower protection film PB and may correspond to (e.g., overlap) the second display area DA2. The lower protection film PB may include an organic insulating material such as polyethylene terephthalate or polyimide.

The thin film transistor TFT and a light emitting diode LED, which is the display device electrically connected to the thin film transistor TFT, may be arranged over the upper surface of the substrate 100.

In an embodiment, the light emitting diode LED may be an organic light emitting diode including an organic material. The organic light emitting diode may emit red, green, or blue light. Alternatively, the light emitting diode LED may be an inorganic light emitting diode including an inorganic material. The inorganic light emitting diode may include a PN junction diode including inorganic semiconductor-based materials. In such an embodiment, when a voltage is applied to a PN junction diode in a forward direction, holes and electrons may be injected thereinto and energy generated by recombination of the holes and electrons may be converted into light energy to emit light of a certain color. The inorganic light emitting diode may have a width of several to several hundred micrometers or several to several hundred nanometers. However, the disclosure is not limited thereto. In one embodiment, for example, the light emitting diode LED may include a quantum dot light emitting diode. An emission layer of the light emitting diode LED may include an organic material, may include an inorganic material, may include quantum dots, may include an organic material and quantum dots, or may include an inorganic material and quantum dots. However, the display device may include a display element other than the light emitting diode. Here, for the convenience of explanation, the light emitting diode will be regarded as the display device.

The light emitting diode LED may be electrically connected to the thin film transistor TFT arranged thereunder. In an embodiment, as illustrated in FIG. 3, a buffer layer 111 is arranged on the substrate 100 and the thin film transistor TFT is arranged on the buffer layer 111. The thin film transistor TFT and the light emitting diode LED electrically connected to the thin film transistor TFT may be arranged in each of the first display area DA1 and the second display area DA2.

A transmission area TA may be located or defined in the second display area DA2. The transmission area TA may be an area through which the light emitted from the component 20 and/or directed to the component 20 may be transmitted. In an embodiment of the display panel 10, the transmittance of the transmission area TA may be about 30% or more, about 40% or more, about 50% or more, about 60% or more, about 70% or more, about 75% or more, about 80% or more, about 85% or more, or about 90% or more.

The component 20 may include a sensor such as a proximity sensor, an illuminance sensor, an iris sensor, or a face recognition sensor and may include a camera (or an image sensor). The component 20 may use light. In one embodiment, for example, the component 20 may emit and/or receive infrared, ultraviolet, or visible light. The proximity sensor using infrared rays may sense an object located close to the upper surface of the electronic apparatus 1, and the illuminance sensor may sense the brightness of light incident on the upper surface of the electronic apparatus 1. Also, the iris sensor may photograph a person's iris arranged over the upper surface of the electronic apparatus 1, and the camera may receive light on an object arranged over the upper surface of the electronic apparatus 1.

In an embodiment, a bottom metal layer BML may be arranged between the substrate 100 and the buffer layer 111 to prevent the function of the thin film transistor TFT arranged in the second display area DA2 from being degraded by the light passing the transmission area TA. The bottom metal layer BML may be located in the second display area DA2 and an opening may be defined through the bottom metal layer BML to overlap the transmission area TA. In one embodiment, for example, the transmission area TA may be defined by an opening of the bottom metal layer BML. The bottom metal layer BML may be disposed between the substrate 100 and the display devices in the second display area DA2.

The encapsulation layer 300 may cover the light emitting diodes LED. The encapsulation layer 300 may include at least one inorganic encapsulation layer and at least one organic encapsulation layer. In one embodiment, for example, the encapsulation layer 300 may include a first inorganic encapsulation layer 310, a second inorganic encapsulation layer 330, and an organic encapsulation layer 320 therebetween (see FIG. 15).

The input sensing layer 400 may be located over the encapsulation layer 300. The input sensing layer 400 may be configured to obtain coordinate information corresponding to an external input, for example, a touch event of an object such as a finger or a stylus pen. The input sensing layer 400 may include a touch electrode and trace lines connected to the touch electrode. The input sensing layer 400 may be configured to sense an external input by a mutual cap method or a self-cap method.

The anti-reflection layer 600 may be configured to reduce the reflectance of light (external light) incident from the outside onto the display panel 10. The anti-reflection layer 600 may include a light blocking layer 610, color filters 620, and an overcoat layer 630. In an embodiment, a fourth opening 610OP1 may be defined through the light blocking layer 610 to overlap the light emitting diode LED of the first display area DA1, a fifth opening 610OP2 may be defined through the light blocking layer 610 to overlap the light emitting diode LED of the second display area DA2, and the color filters 620 may be respectively arranged in the fourth opening 610OP1 and the fifth opening 610OP2. In an embodiment, a sixth opening 610OP3 may be defined through the light blocking layer 610 not to overlap the light emitting diode LED. The sixth opening 610OP3 may be an area corresponding to the transmission area TA, and a portion of the overcoat layer 630 may be located in the sixth opening 610OP3.

The window 700 may be arranged over the anti-reflection layer 600. The window 700 may be coupled to the anti-reflection layer 600 through an adhesive layer such as an optically transparent adhesive. In an embodiment, the window 700 may include a glass material or a plastic material. In such an embodiment, the glass material may include ultra-thin glass. In such an embodiment, the plastic material may include polyether sulfone, polyacrylate, polyether imide, polyethylene naphthalate, polyethylene terephthalate, polyphenylene sulfide, polyarylate, polyimide, polycarbonate, and/or cellulose acetate propionate.

Figure 4:
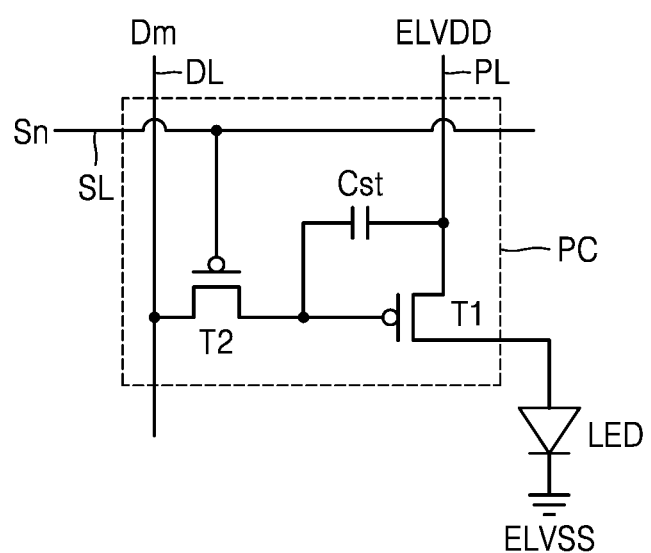
FIG. 4 is an equivalent circuit diagram schematically illustrating a pixel circuit electrically connected to a display device of a display panel according to an embodiment.

FIG. 4 is an equivalent circuit diagram schematically illustrating a pixel circuit PC electrically connected to a display device of a display panel 10 according to an embodiment. In an embodiment, as illustrated in FIG. 4, the pixel circuit PC may include a first thin film transistor T1, a second thin film transistor T2, and a storage capacitor Cst.

In an embodiment, the second thin film transistor T2, which may function as a switching thin film transistor, may be connected to a scan line SL and a data line DL and may be configured to transmit a data signal Dm input from the data line DL to the first thin film transistor T1, in response to a switching signal Sn input from the scan line SL. The storage capacitor Cst may be connected to the second thin film transistor T2 and a driving voltage line PL and may be configured to store a voltage corresponding to the difference between a voltage received from the second thin film transistor T2 and a first power voltage ELVDD supplied to the driving voltage line PL.

In an embodiment, the first thin film transistor T1, which may function As a driving thin film transistor, may be connected to the driving voltage line PL and the storage capacitor Cst and may be configured to control the amount of a driving current flowing from the driving voltage line PL through the light emitting diode LED in response to the voltage stored in the storage capacitor Cst. The light emitting diode LED may emit light with a certain brightness corresponding to the driving current. An opposite electrode (e.g., a cathode) of the light emitting diode LED may be supplied with a second power voltage ELVSS.

Although FIG. 4 illustrates an embodiment where the pixel circuit PC includes two thin film transistors and one storage capacitor, the disclosure is not limited thereto. The number of thin film transistors and the number of storage capacitors may be variously modified according to the design of the pixel circuit PC. In one alternative embodiment, for example, the pixel circuit PC may include three, four, five or more thin film transistors.

Figure 5:
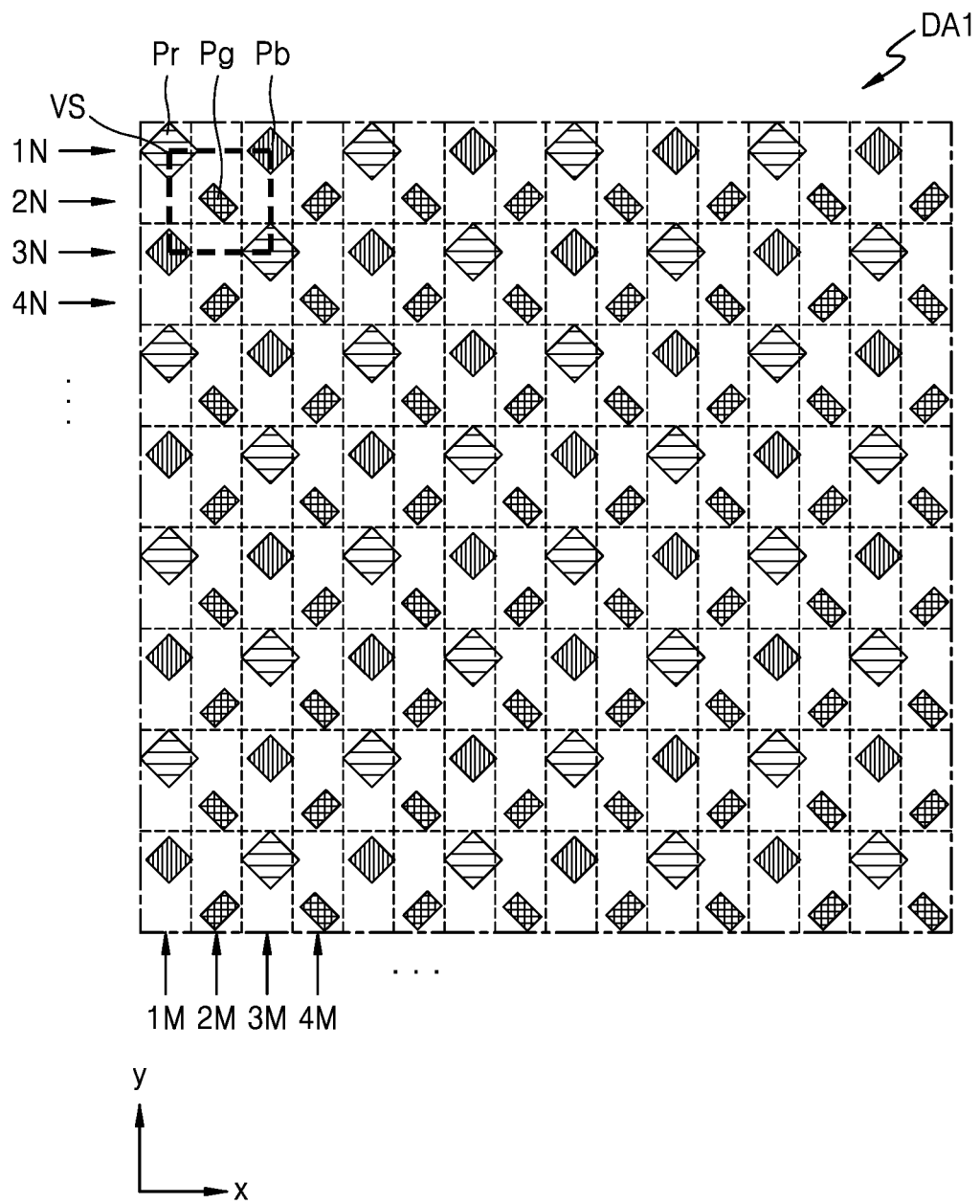
FIG. 5 is a plan view schematically illustrating a portion of a first display area of a display panel according to an embodiment.

FIG. 5 is a plan view schematically illustrating a portion of a first display area DA1 of a display panel 10 according to an embodiment. In an embodiment, as illustrated in FIG. 5, pixels may be arranged in the first display area DA1. The pixels may include first to third pixels that emit light of different colors from each other. Hereinafter, for convenience of description, an embodiment where the first pixel is a red pixel Pr, the second pixel is a green pixel Pg, and the third pixel is a blue pixel Pb will be described in detail.

The red pixel Pr, the green pixel Pg, and the blue pixel Pb may be arranged in the first display area DA1 in a predetermined arrangement. In an embodiment, the red pixel Pr, the green pixel Pg, and the blue pixel Pb may be arranged in a diamond pentile (PenTile®) type as illustrated in FIG. 5.

In one embodiment, for example, a plurality of red pixels Pr and a plurality of blue pixels Pb may be alternately arranged in a first row 1N, a plurality of green pixels Pg may be arranged apart from each other by a certain distance in a second row 2N adjacent thereto, a plurality of blue pixels Pb and a plurality of red pixels Pr may be alternately arranged in a third row 3N adjacent thereto, and a plurality of green pixels Pg may be arranged apart from each other by a certain distance in a fourth row 4N adjacent thereto. This arrangement of pixels may be repeated up to an N-th row. In such an embodiment, the size (or area) of the blue pixel Pb and the red pixel Pr may be greater than the size (or area) of the green pixel Pg.

The plurality of red pixels Pr and blue pixels Pb arranged in the first row 1N and the plurality of green pixels Pg arranged in the second row 2N may be arranged alternately with each other. Thus, a plurality of red pixels Pr and a plurality of blue pixels Pb may be alternately arranged in a first column 1M, a plurality of green pixels Pg may be arranged apart from each other by a certain distance in a second column 2M adjacent thereto, a plurality of blue pixels Pb and a plurality of red pixels Pr may be alternately arranged in a third column 3M adjacent thereto, and a plurality of green pixels Pg may be arranged apart from each other by a certain distance in a fourth column 4M adjacent thereto. This arrangement of pixels may be repeated up to an M-th column.

In such an embodiment, it may be understood that the red pixels Pr are arranged at the first vertex and the third vertex facing each other among the vertexes of a virtual (or imaginary) quadrangle VS having a central point of the green pixel Pg as a central point thereof and the blue pixels Pb are arranged at the second vertex and the fourth vertex that are the other vertexes thereof. In such an embodiment, the virtual quadrangle VS may be variously modified into a rectangle, a rhombus, a square, or the like.

This pixel arrangement structure may be referred to as a diamond pentile (PenTile®) type. In an embodiment having such a pixel arrangement structure, rendering driving for representing colors by sharing adjacent pixels may be applied. Accordingly, a high resolution may be implemented with a small number of pixels.

The red, green, and blue pixels Pr, Pg, and Pb illustrated in FIG. 5 may respectively emit red, green, and blue light by using the light emitting diodes arranged in the corresponding pixels. Thus, the arrangement of pixels may correspond to the arrangement of light emitting diode as display devices. In one embodiment, for example, the position of the red pixel Pr illustrated in FIG. 5 may represent the position of the light emitting diode that emits red light. In such an embodiment, the position of the green pixel Pg may represent the position of the light emitting diode that emits green light, and the position of the blue pixel Pb may represent the position of the light emitting diode that emits blue light.

Figure 6:
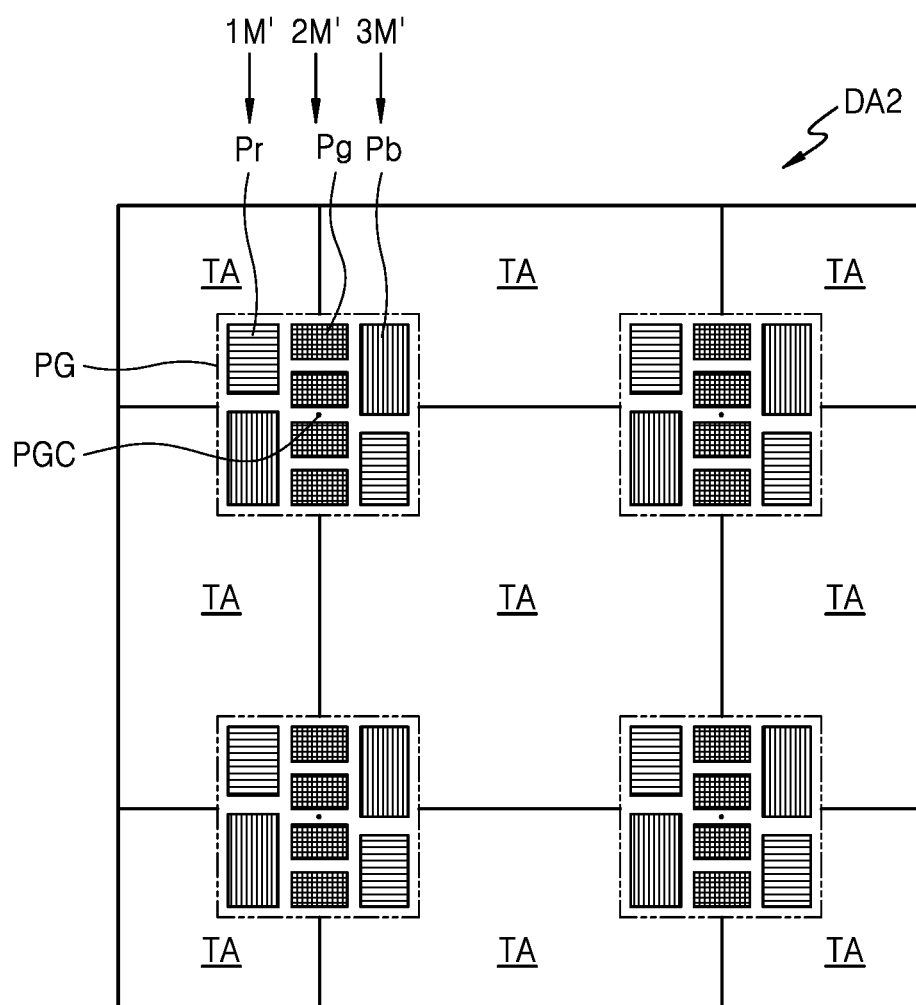
FIGS. 6 and 7 are plan views schematically illustrating a portion of a second display area of a display panel according to an embodiment.
Figure 7:
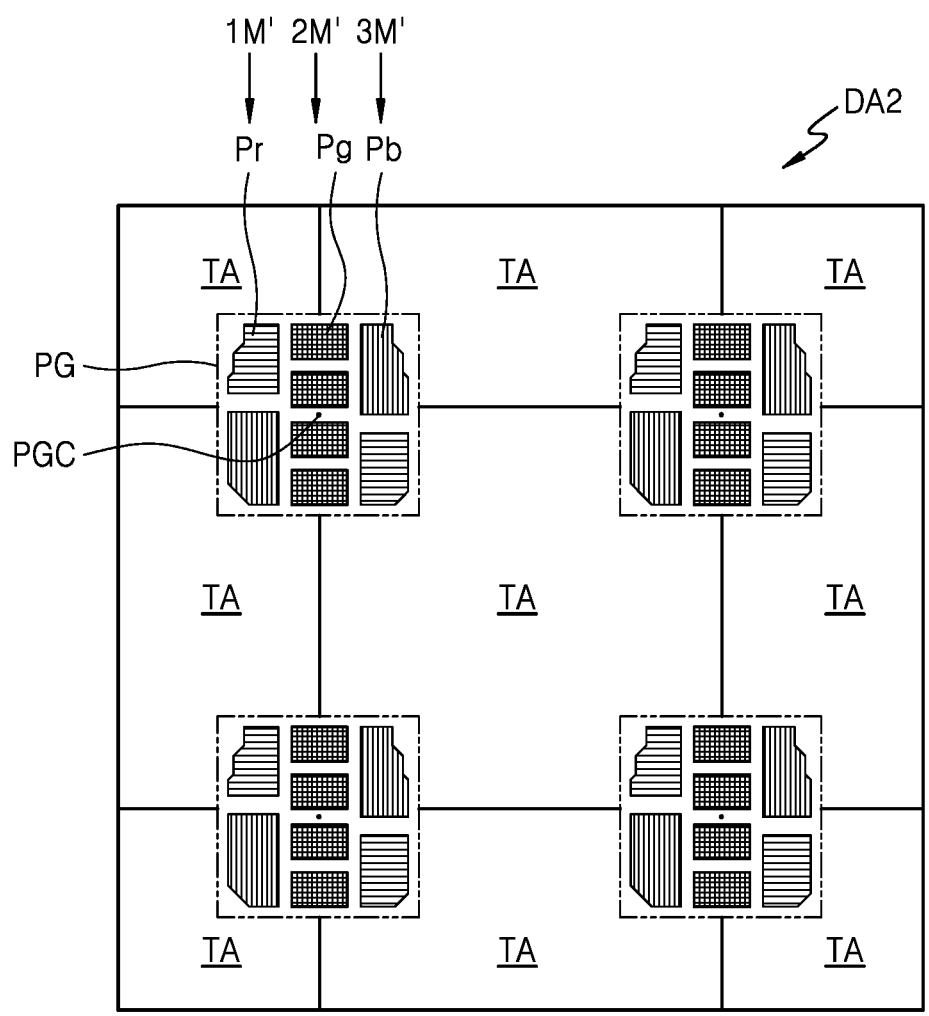

FIGS. 6 and 7 are plan views schematically illustrating a portion of a second display area DA2 of a display panel 10 according to an embodiment. Referring to FIGS. 6 and 7, pixel groups PG may be arranged apart from each other in the second display area DA2. Each pixel group PG located at a portion other than the edge of the second display area DA2 may be surrounded by the transmission area TA and may include pixels that emit light of different colors, for example, a red pixel Pr, a green pixel Pg, and a blue pixel Pb. In one embodiment, for example, each pixel group PG may include two red pixels Pr, four green pixels Pg, and two blue pixels Pb.

A portion where the pixel groups PGs are located in the second display area DA2 may be referred to as a sub display area. That is, the second display area DA2 may include a sub display area and a transmission area TA, and the pixel groups PG may be located in the sub display area.

In an embodiment, as described above with reference to FIG. 5, the red, green, and blue pixels Pr, Pg, and Pb may respectively emit red, green, and blue light by using the light emitting diodes arranged in the corresponding pixels, and thus, the arrangement of pixels may correspond to the arrangement of light emitting diodes as display devices. Therefore, the pixel group PG described with reference to FIGS. 6 and 7 may correspond to a display device group including a light emitting diode that emits red light, a light emitting diode that emits green light, and a light emitting diode that emits blue light. In one embodiment, for example, the fact that the pixel groups PG including the red pixel Pr, the green pixel Pg, and the blue pixel Pb are spaced apart from each other may mean that the display device groups including the light emitting diodes that emit red, green, and blue light are arranged apart from each other.

The pixel group PG may have a symmetrical structure with respect to a center PGC of the pixel group PG. In one embodiment, for example, a red pixel Pr and a blue pixel Pb may be arranged in a first column 1M', and four green pixels Pg may be arranged apart from each other by a certain distance in a second column 2M'. In such an embodiment, a blue pixel Pb and a red pixel Pr may be arranged in a third column 3M'. In such an embodiment, the red pixel Pr arranged in the first column 1M' may be arranged to be symmetrical to the red pixel Pr arranged in the third column 3M', with respect to the center PGC of the pixel group PG. In such an embodiment, the blue pixel Pb arranged in the first column 1M' and the blue pixel Pb arranged in the third column 3M' may be arranged to be symmetrical with respect to the center PGC of the pixel group PG. In such an embodiment, the green pixels Pg arranged in the second column 2M' may be arranged to be symmetrical with respect to the center PGC of the pixel group PG.

The length of the blue pixel Pb in a y-axis direction may be greater than the length of the red pixel Pr in the y-axis direction. The length of the blue pixel Pb in the y-axis direction may be equal to or greater than the sum of the lengths of two green pixels Pg in the y-axis direction.

Referring to FIG. 6, the red pixel Pr, the green pixel Pg, and the blue pixel Pb may have a substantially rectangular shape in a plan view in a thickness direction of the display panel 10. In one embodiment, for example, the red pixel Pr and the blue pixel Pb may have a rectangular shape having a short side in an x-axis direction and a long side in the y-axis direction. The green pixel Pg may have a rectangular shape having a long side in the x-axis direction and a short side in the y-axis direction.

However, the disclosure is not limited thereto. In one alternative embodiment, for example, at least one of the red pixel Pr, the green pixel Pg, and the blue pixel Pb may have an n-gonal shape (here, n is a natural number greater than or equal to 5). In one alternative embodiment, for example, as illustrated in FIG. 7, the green pixel Pg may have a rectangular shape, but the red pixel Pr and the blue pixel Pb may have an edge bent at least once while being adjacent to the transmission area TA and thus may have an n-gonal shape (here, n is a natural number greater than or equal to 5).

Figure 8:
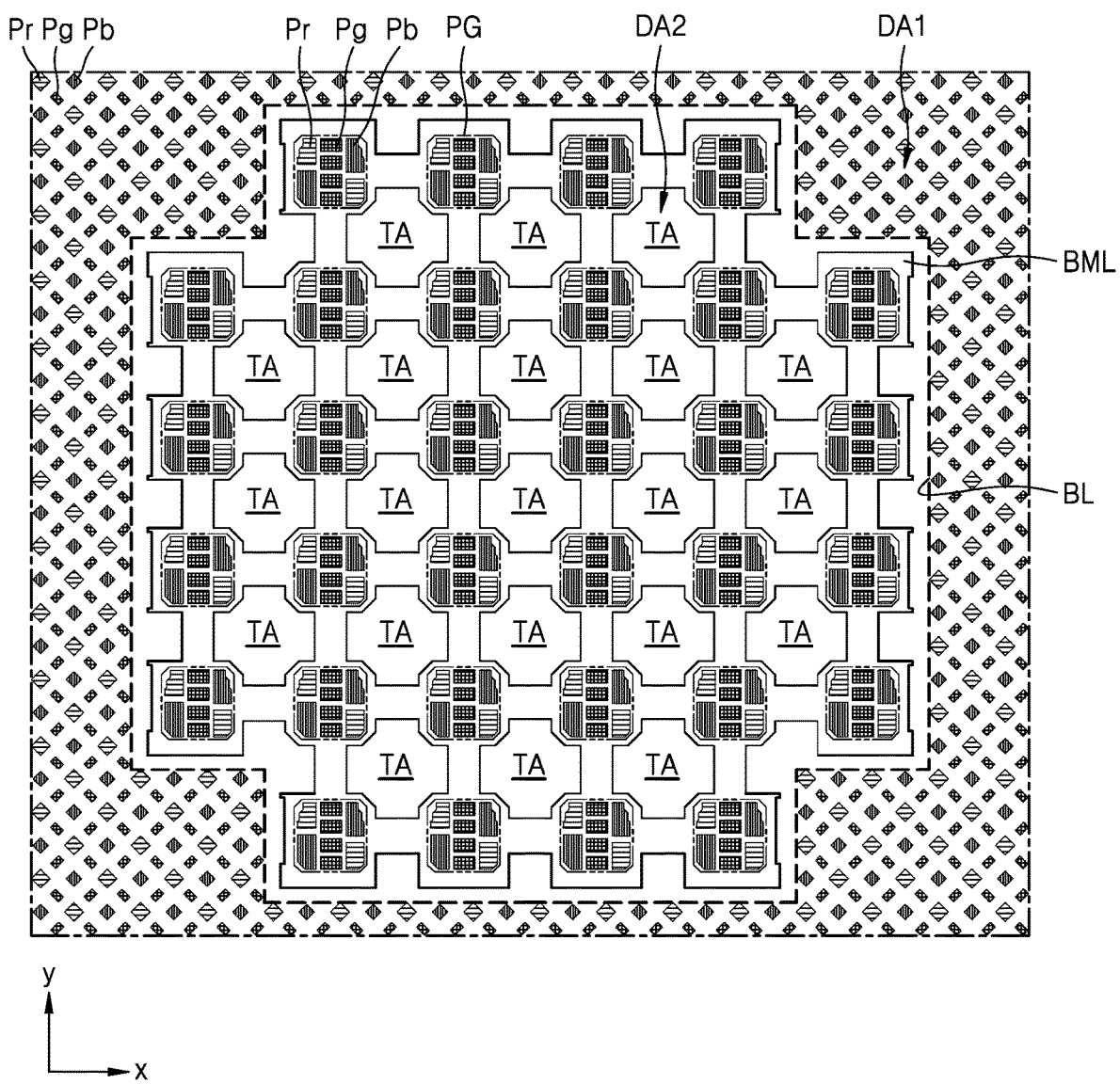
FIG. 8 is a plan view schematically illustrating a second display area of a display panel and a first display area therearound according to an embodiment.
Figure 9:
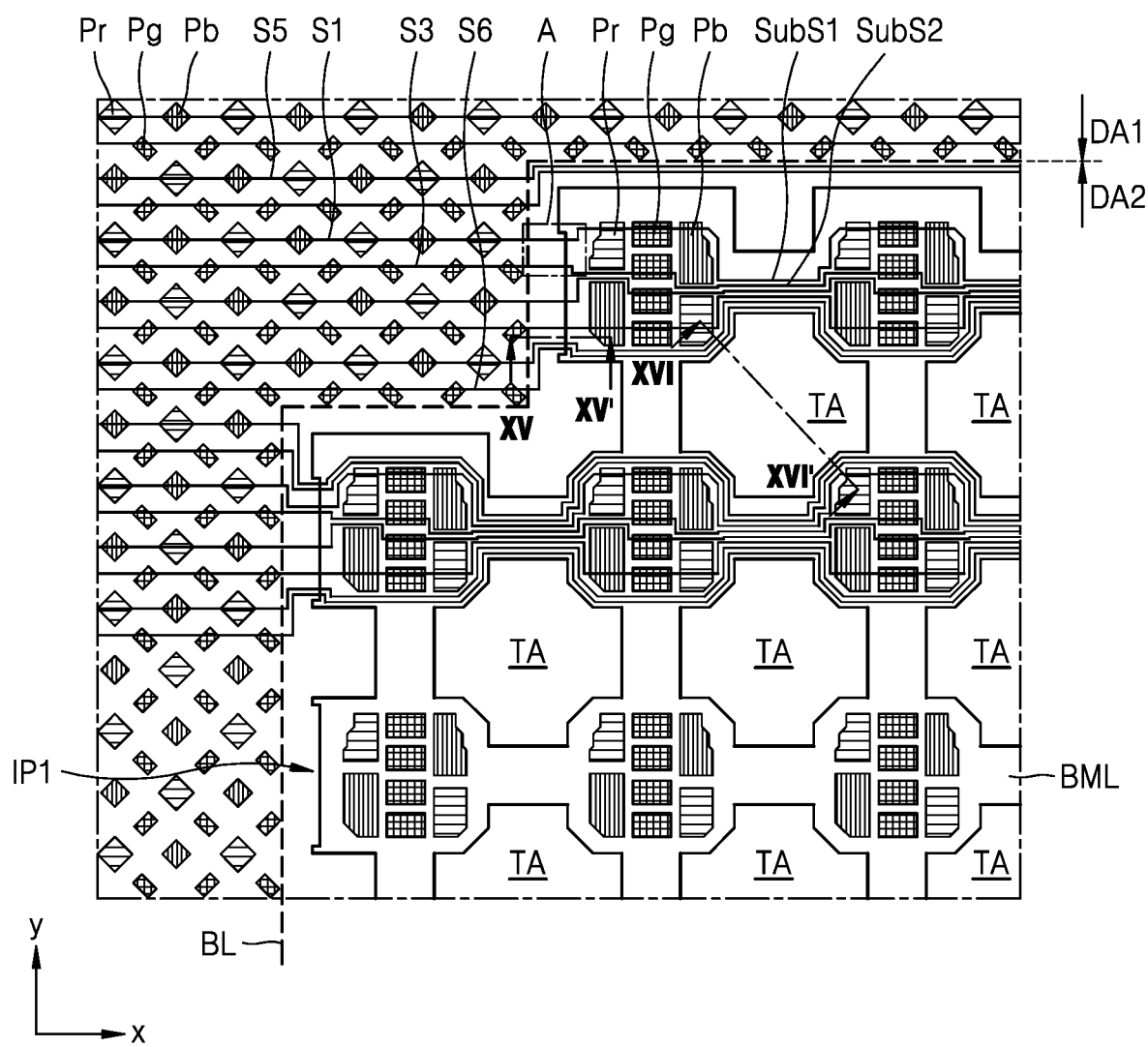
FIG. 9 is an enlarged plan view illustrating a portion of FIG. 8.

FIG. 8 is a plan view schematically illustrating a second display area DA2 of a display panel 10 and a first display area DA1 therearound according to an embodiment, and FIG. 9 is an enlarged plan view illustrating a portion of FIG. 8.

In an embodiment, as illustrated in FIGS. 8 and 9, red pixels Pr, green pixels Pg, and blue pixels Pb may be arranged in the first display area DA1 and the second display area DA2. The arrangement of the red pixels Pr, the green pixels Pg, and the blue pixels Pb arranged in the first display area DA1 may be the same as or different from the arrangement of the red pixels Pr, the green pixels Pg, and the blue pixels Pb arranged in the second display area DA2. FIGS. 8 and 9 illustrate an embodiment where the arrangement of pixels in the first display area DA1 and the arrangement of pixels in the second display area DA2 are different from each other. The arrangement of pixels in FIGS. 8 and 9 may be the same as that described with reference to FIGS. 5, 6, and 7. However, the disclosure is not limited thereto, and alternatively, the red pixel Pr, the green pixel Pg, and the blue pixel Pb arranged in each pixel group PG of the second display area DA2 may have a diamond pentile structure as described above with reference to FIG. 5.

A borderline BL between the first display area DA1 and the second display area DA2 may have a polygonal shape as illustrated in FIG. 8 in the plan view. FIG. 8 illustrates an embodiment where the borderline BL has a polygonal shape having 12 sides (e.g., a substantially cross shape). However, the disclosure is not limited thereto, and alternatively, a corner portion of the polygonal shape may have a step configuration. However, in such an embodiment, the number of sides formed by the borderline BL may be less than or greater than 12. In one embodiment, for example, the borderline BL between the first display area DA1 and the second display area DA2 may have a tetragonal shape having 4 sides or may have a polygonal shape having more than 12 sides.

In an embodiment, as illustrated in FIG. 9, the pixels of the first display area DA1 and the pixels of the second display area DA2 may be spaced apart from each other by a predetermined distance. The predetermined distance may be greater than the distance between adjacent pixels arranged in the first display area DA1 and may also be greater than the distance between adjacent pixels arranged in one pixel group PG in the second display area DA2. The cross-sectional structures of the pixels arranged in the first display area DA1 and the second display area DA2 will be described below in detail with reference to FIG. 15.

A transmission area TA may be located or defined in the second display area DA2. The outermost line of the transmission area TA may be defined by a bottom metal layer BML. In such an embodiment, because second opening portions are defined through the bottom metal layer BML as described above with reference to FIG. 3, the second opening portions of the bottom metal layer BML may correspond to the transmission area TA. In such an embodiment, when viewed from a direction perpendicular to the substrate 100 (i.e., in a plan view in a thickness direction of the substrate 100 or the display panel 10), the second opening portions of the bottom metal layer BML may overlap the transmission area TA.

In an embodiment, as described above with reference to FIG. 3, the transmission area TA may be an area through which light and/or sound may be transmitted, and the component 20 (see FIG. 3) may be arranged to overlap the transmission area TA. However, not all portions of the component 20 may correspond to the transmission area TA, and as illustrated in FIG. 3, a portion of the component 20 may correspond to the transmission area TA and another portion thereof may correspond to the second display devices in the second display area DA2.

In an embodiment, as illustrated in FIG. 8, a transmission area TA may be arranged or defined between the pixel groups PG. Because a light emitting diode is located in each pixel, the transmission area TA may be considered as being disposed between the light emitting diode of one pixel group PG and the light emitting diode of another pixel group PG.

In an embodiment, the space between the first display area DA1 and the pixel group PG located at the outermost side in the second display area DA2 may not be a transmission area. In such an embodiment, there may be a portion where the bottom metal layer BML does not exist in the space between the first display area DA1 and the pixel group PG located at the outermost side in the second display area DA2, but the portion may not be a transparent area.

In such an embodiment, as described above with reference to FIG. 4, a switching signal Sn may be transmitted from the scan line SL to the pixel circuit PC electrically connected to the light emitting diode LED. One scan line SL may pass or extend along a plurality of pixels located in one row. FIG. 9 illustrates a portion of the scan lines SL.

In the case of the pixels located in the +y direction of the second display area DA2 among the pixels located in the first display area DA1, a scan line extending in the x-axis direction (or +x direction) may pass the pixels located in one row. In the case of the pixels located in the −x direction away from the second display area DA2 among the pixels located in the first display area DA1, a scan line extending in the x-axis direction may extend into the second display area DA2 after passing the pixels located in one row. FIG. 9 illustrates an embodiment where a first scan line S1 extends (in the +x direction) from the first display area DA1 into the second display area DA2 across one side of the second display area DA2. Here, "the first scan line S1 passes the pixels located in one row in the first display area DA1" may mean that the first scan line S1 passes some of the first display devices located in the first display area DA1.

Even in the case of the pixels located in the second display area DA2, a sub scan line extending substantially in the x-axis direction may pass the pixels located in one row. FIG. 9 illustrates an embodiment in which a first sub scan line SubS1 extends substantially in the x-axis direction. Here, "the first sub scan line SubS1 passes the pixels located in one row in the second display area DA2" may mean that the first sub scan line SubS1 passes some of the second display devices located in the second display area DA2. The first sub scan line SubS1 may be electrically connected to the first scan line S1 by a first bridge line BR1 (see FIG. 10).

Figure 10:
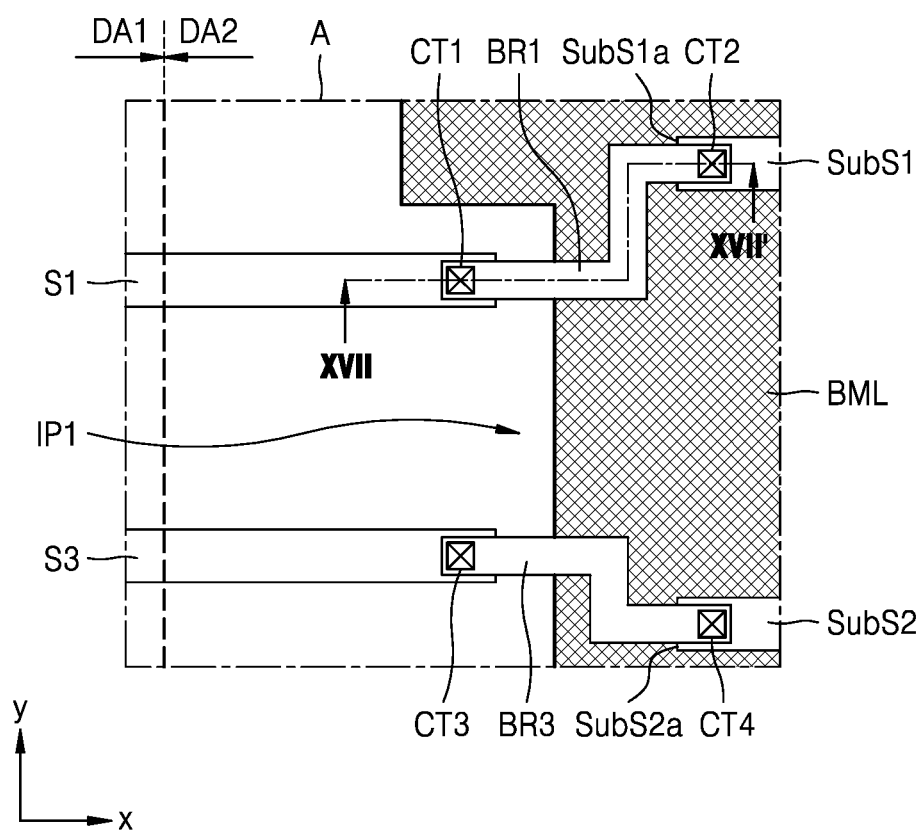
FIG. 10 is an enlarged plan view illustrating region A of FIG. 9.

FIG. 10 is an enlarged plan view illustrating region A of FIG. 9. In an embodiment, as illustrated in FIG. 10, the first scan line S1 located at a portion of the first display area DA1 in the −x direction from the second display area DA2 may extend from the first display area DA1 into the second display area DA2 across the one side of the second display area DA2. In the case of the first sub scan line SubS1 located in the second display area DA2, a first end SubS1a of the first sub scan line SubS1 may be arranged to substantially face the first scan line S1 with respect to the center of the second display area DA2. In such an embodiment, the first end SubS1a of the first sub scan line SubS1 may be arranged to be located substantially to the direction of the first scan line S1 with respect to the y axis passing the center of the second display area DA2. In such an embodiment, the first bridge line BR1 may electrically connect the first scan line S1 to the first sub scan line SubS1. In such an embodiment, the bottom metal layer BML located in the second display area DA2 may not overlap the first scan line S1 when viewed from the direction perpendicular to the substrate 100.

In a process of manufacturing the display panel 10, the substrate 100 and the like may pass through various manufacturing apparatuses. In the manufacturing process, an electric charge may exist in the bottom metal layer BML due to friction or the like. As illustrated in FIG. 8, the bottom metal layer BML may be integrally formed as a single unitary body in the second display area DA2, and accordingly, the amount of an electric charge accumulated in the bottom metal layer BML located in the overall area of the second display area DA2 may increase rapidly. In this case, when the electric charge is transmitted into the first display area DA1, a short may occur between the components in a partial area of the first display area DA1, thereby causing a defect.

If the first scan line S1 extending from the first display area DA1 into the second display area DA2 across the one side of the second display area DA2 overlaps the bottom metal layer BML unlike the illustration in FIG. 10, the electric charges accumulated in the bottom metal layer BML in the process of manufacturing the display panel 10 may move to the first scan line S1 located adjacent to the bottom metal layer BML. In this case, the electric charges may move to the first display area DA1 along the first scan line S1, and a short may be induced due to a potential difference between the first scan line S1 and a semiconductor layer located adjacent to the first scan line S1. Accordingly, defective pixels may occur along the first scan line S1 in the first display area DA1 of the display panel 10.

In embodiments of the display panel 10 according to the invention, the bottom metal layer BML located in the second display area DA2 may not overlap the first scan line S1 when viewed from the direction perpendicular to the substrate 100. Accordingly, the movement of the electric charges accumulated in the bottom metal layer BML in the process of manufacturing the display panel 10 to the first scan line S1 may be effectively prevented or minimized. In an embodiment, the first sub scan line SubS1 may overlap the bottom metal layer BML when viewed from the direction perpendicular to the substrate 100.

As described above, the first scan line S1 and the first sub scan line SubS1 may be electrically connected by the first bridge line BR1. That is, one end of the first bridge line BR1 may be connected to an end of the first scan line S1 in the second display area DA2 through a first contact hole CT1, and the other end of the first bridge line BR1 may be connected to the vicinity of the first end SubS1a of the first sub scan line SubS1 through a second contact hole CT2. Accordingly, the first bridge line BR1 may overlap the first end SubS1a of the first sub scan line SubS1 when viewed from the direction perpendicular to the substrate 100. In such an embodiment, when viewed from the direction perpendicular to the substrate 100, the bottom metal layer BML may overlap a portion of the first bridge line BR1 where the first end SubS1a of the first sub scan line SubS1 and the first bridge line BR1 overlap each other.

In an embodiment, the distance of the first bridge line BR1 from the upper surface of the substrate 100 may be greater than the distance of the first scan line S1 from the upper surface of the substrate 100. Thus, because the distance from the bottom metal layer BML to the first bridge line BR1 may also be sufficiently great, the electric charges accumulated in the bottom metal layer BML may not easily move to the first bridge line BR1. Thus, the occurrence of defective pixels in the pixels passed by the first scan line S1 in the first display area DA1 may be prevented or minimized because the bottom metal layer BML located in the second display area DA2 does not overlap the first scan line S1 when viewed from the direction perpendicular to the substrate 100.

In such an embodiment, the bottom metal layer BML may have a first indent portion IP1 indented into the bottom metal layer BML when viewed from the direction perpendicular to the substrate 100. The first indent portion IP1 may be formed or defined by a portion of the bottom metal layer BML in the direction to the first scan line S1. Accordingly, a sufficient space may be secured between the first display area DA1 and the bottom metal layer BML in the second display area DA2, and as a result, the bottom metal layer BML may not overlap the first scan line S1 when viewed from the direction perpendicular to the substrate 100. The first scan line S1 and the first bridge line BR1 may contact each other in the first indent portion IP1. That is, the first contact hole CT1 for a contact between the first scan line S1 and the first bridge line BR1 may be located in the first indent portion IP1.

Figure 11:
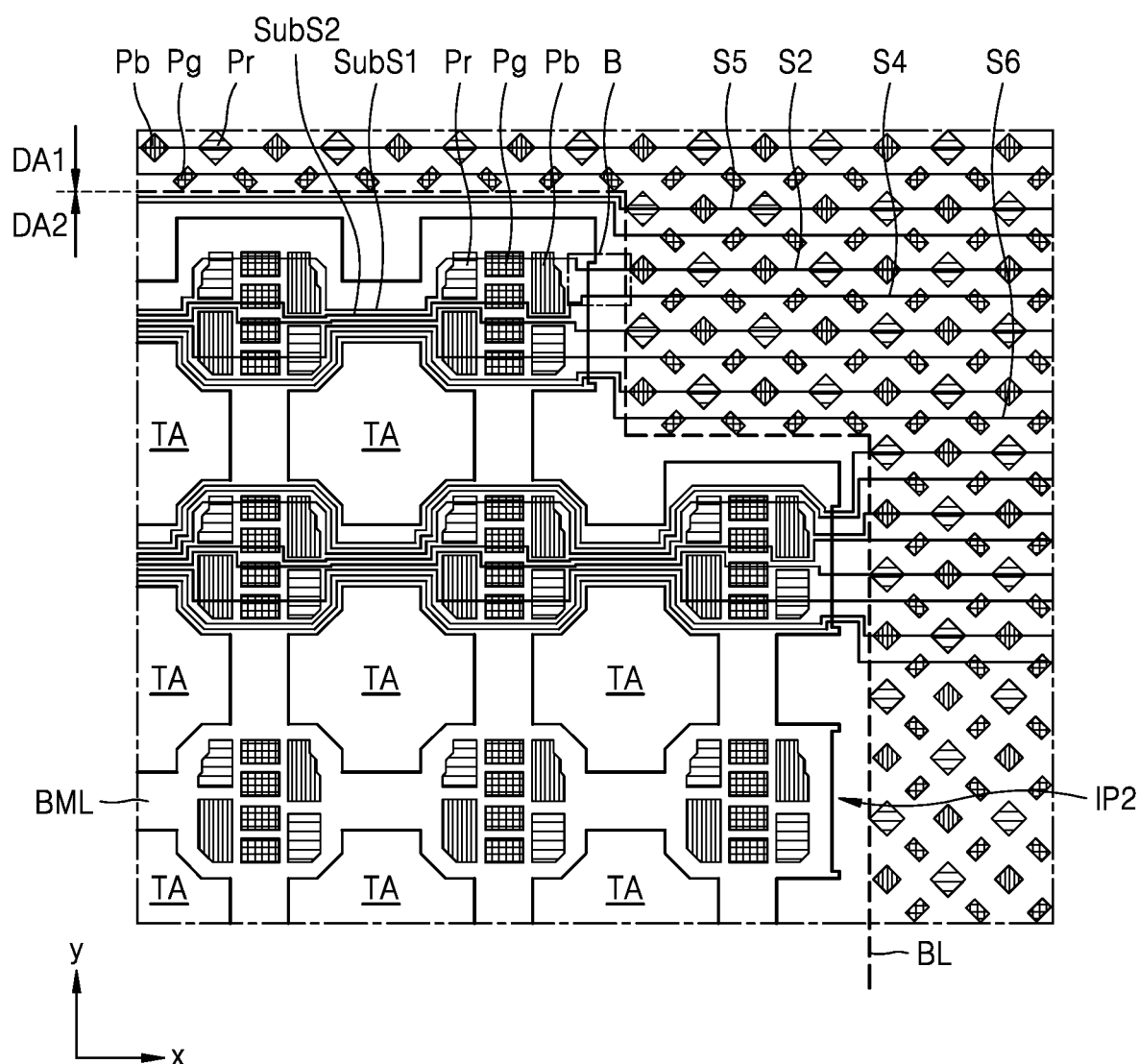
FIG. 11 is an enlarged plan view illustrating another portion of FIG. 8.
Figure 12:
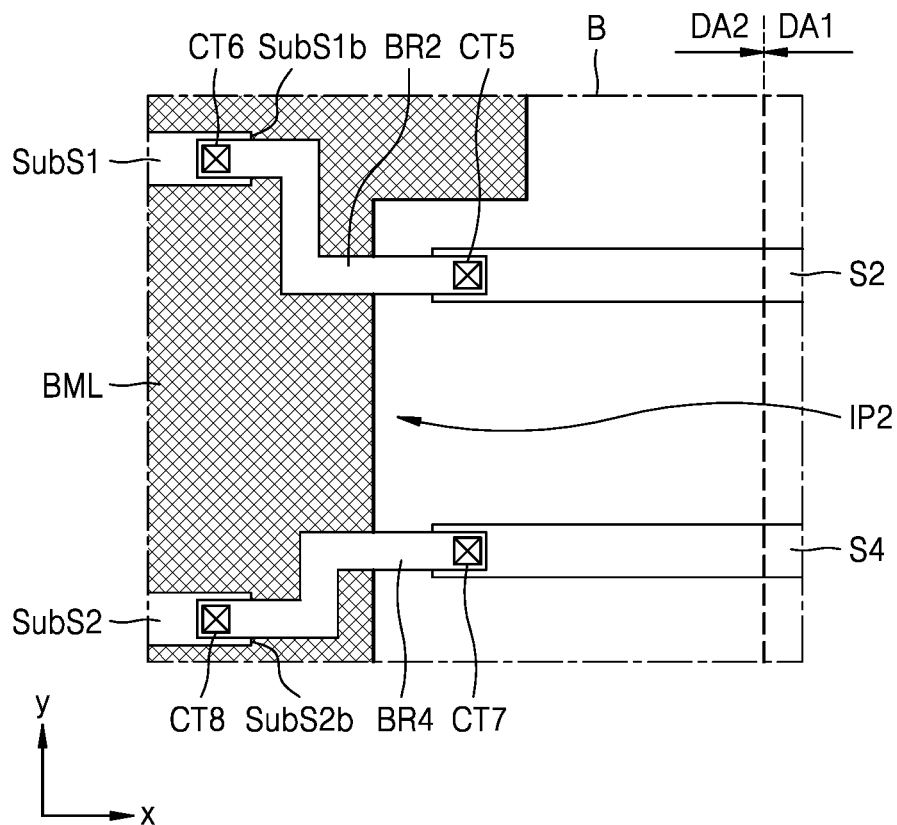
FIG. 12 is an enlarged plan view illustrating region B of FIG. 11.

FIG. 11 is an enlarged plan view illustrating another portion of FIG. 8, and FIG. 12 is an enlarged plan view illustrating region B of FIG. 11. FIGS. 9 and 10 are plan views illustrating the vicinity of the upper left end of the second display area DA2 of FIG. 8, and FIGS. 11 and 12 are plan views illustrating the vicinity of the upper right end of the second display area DA2 of FIG. 8.

In an embodiment, as illustrated in FIGS. 11 and 12, at the edge of the second display area DA2 in the +x direction, the pixels of the first display area DA1 and the pixels of the second display area DA2 are spaced apart from each other by a predetermined distance. The predetermined distance may be greater than the distance between adjacent pixels arranged in the first display area DA1 and may also be greater than the distance between adjacent pixels arranged in one pixel group PG in the second display area DA2.

In such an embodiment, as described above with reference to FIG. 4, a switching signal Sn may be transmitted from the scan line SL to the pixel circuit PC electrically connected to the light emitting diode LED. One scan line SL may pass a plurality of pixels located in one row. FIG. 11 illustrates a portion of the scan lines SL.

In the case of the pixels located in the y-axis direction (or +y direction) from the second display area DA2 among the pixels located in the first display area DA1, a scan line extending in the x-axis direction may pass the pixels located in one row. In the case of the pixels located in the +x direction from the second display area DA2 among the pixels located in the first display area DA1, a scan line extending in the x-axis direction may extend into the second display area DA2 after passing the pixels located in one row. FIG. 11 illustrates an embodiment where a second scan line S2 extends (in the −x direction) from the first display area DA1 into the second display area DA2 across another side of the second display area DA2.

Here, as described above with reference to FIG. 9, "the first scan line S1 passes the pixels located in one row in the first display area DA1" may mean that the first scan line S1 passes some of the first display devices located in the first display area DA1. Here, "the second scan line S2 passes the pixels located in one row in the first display area DA1" may mean that the second scan line S2 passes some others of the first display devices located in the first display area DA1.

In an embodiment, as described above with reference to FIG. 10, the first sub scan line SubS1 may be electrically connected to the first scan line S1 by the first bridge line BR1. In such an embodiment, the first sub scan line SubS1 may be electrically connected to the second scan line S2 by a second bridge line BR2 as illustrated in FIG. 12.

In an embodiment, as illustrated in FIG. 12 that is an enlarged plan view illustrating region B of FIG. 11, the second scan line S2 located at a portion of the first display area DA1 in the +x direction from the second display area DA2 may extend from the first display area DA1 into the second display area DA2 across the another side of the second display area DA2. In the case of the first sub scan line SubS1 located in the second display area DA2, a second end SubS1b of the first sub scan line SubS1 may be arranged to substantially face the second scan line S2 with respect to the center of the second display area DA2. That is, the second end SubS1b of the first sub scan line SubS1 may be arranged to be located substantially in the direction to the second scan line S2 with respect to the y axis passing the center of the second display area DA2. In such an embodiment, the second bridge line BR2 may electrically connect the second scan line S2 to the first sub scan line SubS1. In such an embodiment, the bottom metal layer BML located in the second display area DA2 may not overlap the second scan line S2 when viewed from the direction perpendicular to the substrate 100. Accordingly, the movement of the electric charges accumulated in the bottom metal layer BML in a process of manufacturing the display panel 10 to the second scan line S2 may be effectively prevented or minimized.

In an embodiment, as described above, the second scan line S2 and the first sub scan line SubS1 may be electrically connected by the second bridge line BR2. In such an embodiment, one end of the second bridge line BR2 may be connected to an end of the second scan line S2 in the second display area DA2 through a fifth contact hole CT5, and the other end of the second bridge line BR2 may be connected to the vicinity of the second end SubS1b of the first sub scan line SubS1 through a sixth contact hole CT6. Accordingly, the second bridge line BR2 may overlap the second end SubS1b of the first sub scan line SubS1 when viewed from the direction perpendicular to the substrate 100. In such an embodiment, when viewed from the direction perpendicular to the substrate 100, the bottom metal layer BML may overlap a portion of the second bridge line BR2 where the second end SubS1b of the first sub scan line SubS1 and the second bridge line BR2 overlap each other.

In an embodiment, the distance of the second bridge line BR2 from the upper surface of the substrate 100 may be greater than the distance of the second scan line S2 from the upper surface of the substrate 100. Thus, because the distance from the bottom metal layer BML to the second bridge line BR2 may also be sufficiently great, the electric charges accumulated in the bottom metal layer BML may not easily move to the second bridge line BR2. Thus, the occurrence of defective pixels in the pixels passed by the second scan line S2 of the first display area DA1 may be effectively prevented or minimized because the bottom metal layer BML located in the second display area DA2 does not overlap the second scan line S2 when viewed from the direction perpendicular to the substrate 100.

In an embodiment, the bottom metal layer BML may have a second indent portion IP2 indented into the bottom metal layer BML when viewed from the direction perpendicular to the substrate 100. The second indent portion IP2 may be formed or defined by a portion of the bottom metal layer BML to the direction of the second scan line S2. Accordingly, a sufficient space may be secured between the first display area DA1 and the bottom metal layer BML in the second display area DA2, and as a result, the bottom metal layer BML may not overlap the second scan line S2 when viewed from the direction perpendicular to the substrate 100. The second scan line S2 and the second bridge line BR2 may contact each other in the second indent portion IP2. In such an embodiment, the fifth contact hole CT5 for a contact between the second scan line S2 and the second bridge line BR2 may be located in the second indent portion IP2.

In an embodiment, as illustrated in FIGS. 9 and 10, the display panel 10 may further include a third scan line S3, a second sub scan line SubS2, and a third bridge line BR3.

The third scan line S3 may be substantially parallel to the first scan line S1. Like the first scan line S1, the third scan line S3 may extend into the second display area DA2 (in the +x direction) across the one side of the second display area DA2 after passing the first display devices located in one row located in the −x direction from the second display area DA2 among the first display devices located in the first display area DA1. The third scan line S3 may be electrically connected to the second sub scan line SubS2 by the third bridge line BR3.

In such an embodiment, as illustrated in FIG. 10 that is an enlarged plan view illustrating region A of FIG. 9, the third scan line S3 located at a portion of the first display area DA1 in the −x direction from the second display area DA2 may extend from the first display area DA1 into the second display area DA2 across the one side of the second display area DA2. In the case of the second sub scan line SubS2 located in the second display area DA2, a third end SubS2*a* of the second sub scan line SubS2 may be arranged to substantially face the third scan line S3 with respect to the center of the second display area DA2. That is, the third end SubS2*a* of the second sub scan line SubS2 may be arranged to be located substantially to the direction of the third scan line S3 with respect to the y axis passing the center of the second display area DA2. In such an embodiment, the third bridge line BR3 may electrically connect the third scan line S3 to the second sub scan line SubS2. In such an embodiment, the bottom metal layer BML located in the second display area DA2 may not overlap the third scan line S3 when viewed from the direction perpendicular to the substrate 100. Accordingly, the movement of the electric charges accumulated in the bottom metal layer BML in the process of manufacturing the display panel 10 to the third scan line S3 may be effectively prevented or minimized. In an embodiment, the second sub scan line SubS2 may overlap the bottom metal layer BML when viewed from the direction perpendicular to the substrate 100.

In an embodiment, as described above, the third scan line S3 and the second sub scan line SubS2 may be electrically connected by the third bridge line BR3. In such an embodiment, one end of the third bridge line BR3 may be connected to an end of the third scan line S3 in the second display area DA2 through a third contact hole CT3, and the other end of the third bridge line BR3 may be connected to the vicinity of the third end SubS2*a* of the second sub scan line SubS2 through a fourth contact hole CT4. Accordingly, the third bridge line BR3 may overlap the third end SubS2*a* of the second sub scan line SubS2 when viewed from the direction perpendicular to the substrate 100. In such an embodiment, when viewed from the direction perpendicular to the substrate 100, the bottom metal layer BML may overlap a portion of the third bridge line BR3 where the third end SubS2*a* of the second sub scan line SubS2 and the third bridge line BR3 overlap each other.

In an embodiment, the distance of the third bridge line BR3 from the upper surface of the substrate 100 may be greater than the distance of the third scan line S3 from the upper surface of the substrate 100. Thus, because the distance from the bottom metal layer BML to the third bridge line BR3 may also be sufficiently great, the electric charges accumulated in the bottom metal layer BML may not easily move to the third bridge line BR3. Thus, the occurrence of defective pixels in the pixels passed by the third scan line S3 of the first display area DA1 may be prevented or minimized because the bottom metal layer BML located in the second display area DA2 does not overlap the third scan line S3 when viewed from the direction perpendicular to the substrate 100.

In an embodiment, as described above, the bottom metal layer BML may have a first indent portion IP1 indented into the bottom metal layer BML when viewed from the direction perpendicular to the substrate 100. The third scan line S3 and the third bridge line BR3 may contact each other in the first indent portion IP1. In such an embodiment, the third contact hole CT3 for a contact between the third scan line S3 and the third bridge line BR3 may be located in the first indent portion IP1.

In an embodiment, as illustrated in FIGS. 11 and 12, the display panel 10 may further include a fourth scan line S4 and a fourth bridge line BR4. The fourth scan line S4 may be substantially parallel to the second scan line S2. Like the second scan line S2, the fourth scan line S4 may extend (in the −x direction) into the second display area DA2 across the another side of the second display area DA2 after passing the first display devices located in one row located in the +x direction from the second display area DA2 among the first display devices located in the first display area DA1. The fourth scan line S4 may be electrically connected to the second sub scan line SubS2 by the fourth bridge line BR4.

In an embodiment, as illustrated in FIG. 12 that is an enlarged plan view illustrating region B of FIG. 11, the fourth scan line S4 located at a portion of the first display area DA1 in the +x direction from the second display area DA2 may extend from the first display area DA1 into the second display area DA2 across the another side of the second display area DA2. In the case of the second sub scan line SubS2 located in the second display area DA2, a fourth end SubS2*b* of the second sub scan line SubS2 may be arranged to substantially face the fourth scan line S4 with respect to the center of the second display area DA2. That is, the fourth end SubS2*b* of the second sub scan line SubS2 may be arranged to be located substantially in the direction to the fourth scan line S4 with respect to the y axis passing the center of the second display area DA2. In such an embodiment, the fourth bridge line BR4 may electrically connect the fourth scan line S4 to the second sub scan line SubS2. In such an embodiment, the bottom metal layer BML located in the second display area DA2 may not overlap the fourth scan line S4 when viewed from the direction perpendicular to the substrate 100. Accordingly, the movement of the electric charges accumulated in the bottom metal layer BML in the process of manufacturing the display panel 10 to the fourth scan line S4 may be effectively prevented or minimized.

In an embodiment, as described above, the fourth scan line S4 and the second sub scan line SubS2 may be electrically connected by the fourth bridge line BR4. In such an embodiment, one end of the fourth bridge line BR4 may be connected to an end of the fourth scan line S4 in the second display area DA2 through a seventh contact hole CT7, and the other end of the fourth bridge line BR4 may be connected to the vicinity of the fourth end SubS2*b* of the second sub scan line SubS2 through an eighth contact hole CTB. Accordingly, the fourth bridge line BR4 may overlap the fourth end SubS2*b* of the second sub scan line SubS2 when viewed from the direction perpendicular to the substrate 100. In such an embodiment, when viewed from the direction perpendicular to the substrate 100, the bottom metal layer BML may overlap a portion of the fourth bridge line BR4 where the fourth end SubS2*b* of the second sub scan line SubS2 and the fourth bridge line BR4 overlap each other.

In an embodiment, the distance of the fourth bridge line BR4 from the upper surface of the substrate 100 may be greater than the distance of the fourth scan line S4 from the upper surface of the substrate 100. Thus, because the distance from the bottom metal layer BML to the fourth bridge line BR4 may also be sufficiently great, the electric charges accumulated in the bottom metal layer BML may not easily move to the fourth bridge line BR4. Thus, the occurrence of defective pixels in the pixels passed by the fourth scan line S4 of the first display area DA1 may be prevented or minimized because the bottom metal layer BML located in the second display area DA2 does not overlap the fourth scan line S4 when viewed from the direction perpendicular to the substrate 100.

In an embodiment, as described above, the bottom metal layer BML may have a second indent portion IP2 indented into the bottom metal layer BML when viewed from the direction perpendicular to the substrate 100. The fourth scan line S4 and the fourth bridge line BR4 may contact each other in the second indent portion IP2. In such an embodiment, the seventh contact hole CT7 for a contact between the fourth scan line S4 and the fourth bridge line BR4 may be located in the second indent portion IP2.

Figure 13:
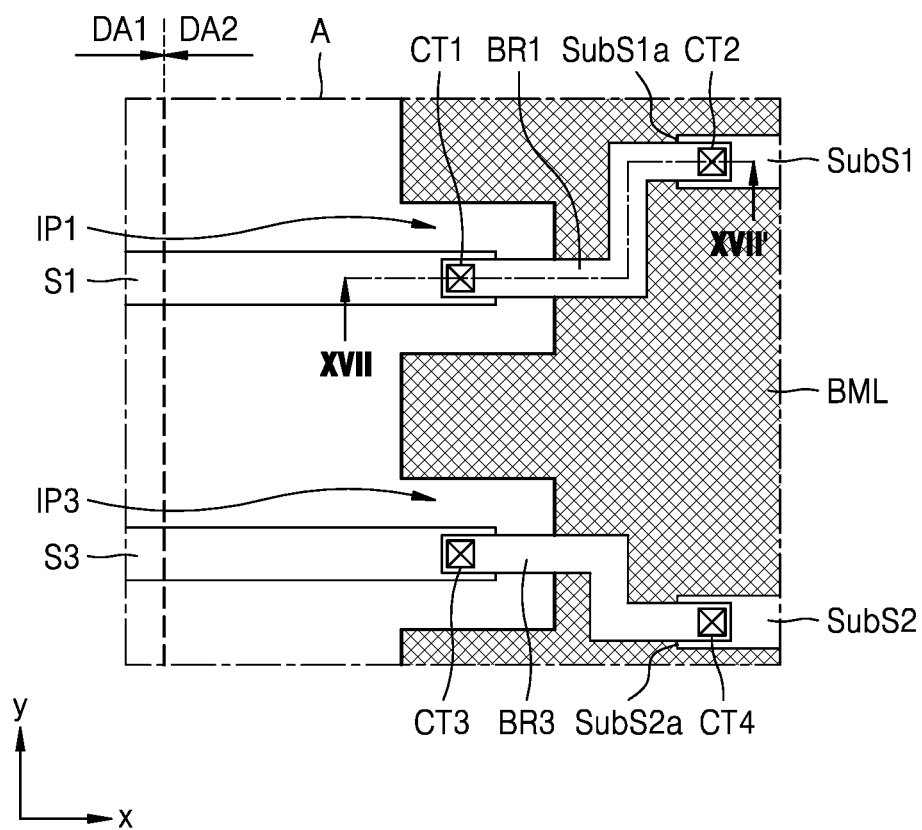
FIG. 13 is a plan view schematically illustrating a portion of a display panel according to an alternative embodiment.

However, the disclosure is not limited thereto. In one alternative embodiment, for example, as illustrated in FIG. 13 that is a plan view schematically illustrating a portion of a display panel 10, the bottom metal layer BML may also have a third indent portion IP3 in addition to the first indent portion IP1 indented into the bottom metal layer BML when viewed from the direction perpendicular to the substrate 100. The first indent portion IP1 may be formed or defined by a portion of the bottom metal layer BML in the direction to the first scan line S1, and the third indent portion IP3 may be formed or defined by a portion of the bottom metal layer BML in the direction to the third scan line S3. Accordingly, a sufficient space may be secured between the first display area DA1 and the bottom metal layer BML in the second display area DA2, and as a result, the bottom metal layer BML may not overlap the first scan line S1 and the third scan line S3 when viewed from the direction perpendicular to the substrate 100.

The first scan line S1 and the first bridge line BR1 may contact each other in the first indent portion IP1, and the third scan line S3 and the third bridge line BR3 may contact each other in the third indent portion IP3. That is, the first contact hole CT1 for a contact between the first scan line S1 and the first bridge line BR1 may be located or defined in the first indent portion IP1, and the third contact hole CT3 for a contact between the third scan line S3 and the third bridge line BR3 may be located or defined in the third indent portion IP3.

Figure 14:
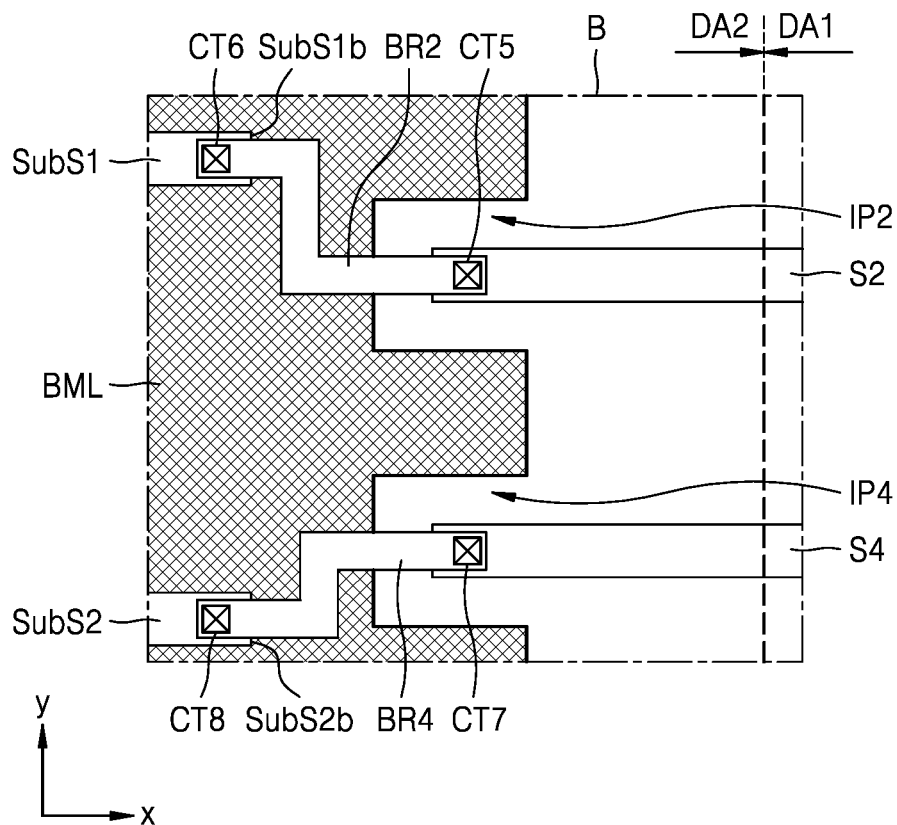
FIG. 14 is a plan view schematically illustrating a portion of a display panel according to another alternative embodiment.

In such an embodiment, as illustrated in FIG. 14 that is a plan view schematically illustrating a portion of a display panel 10, the bottom metal layer BML may also have a fourth indent portion IP4 in addition to the second indent portion IP2 indented into the bottom metal layer BML when viewed from the direction perpendicular to the substrate 100. The second indent portion IP2 may be formed or defined by a portion of the bottom metal layer BML in the direction to the second scan line S2, and the fourth indent portion IP4 may be formed or defined by a portion of the bottom metal layer BML in the direction to the fourth scan line S4. Accordingly, a sufficient space may be secured between the first display area DA1 and the bottom metal layer BML in the second display area DA2, and as a result, the bottom metal layer BML may not overlap the second scan line S2 and the fourth scan line S4 when viewed from the direction perpendicular to the substrate 100.

The second scan line S2 and the second bridge line BR2 may contact each other in the second indent portion IP2, and the fourth scan line S4 and the fourth bridge line BR4 may contact each other in the fourth indent portion IP4. That is, the fifth contact hole CT5 for a contact between the second scan line S2 and the second bridge line BR2 may be located or defined in the second indent portion IP2, and the seventh contact hole CT7 for a contact between the fourth scan line S4 and the fourth bridge line BR4 may be located or defined in the fourth indent portion IP4.

Figure 15:
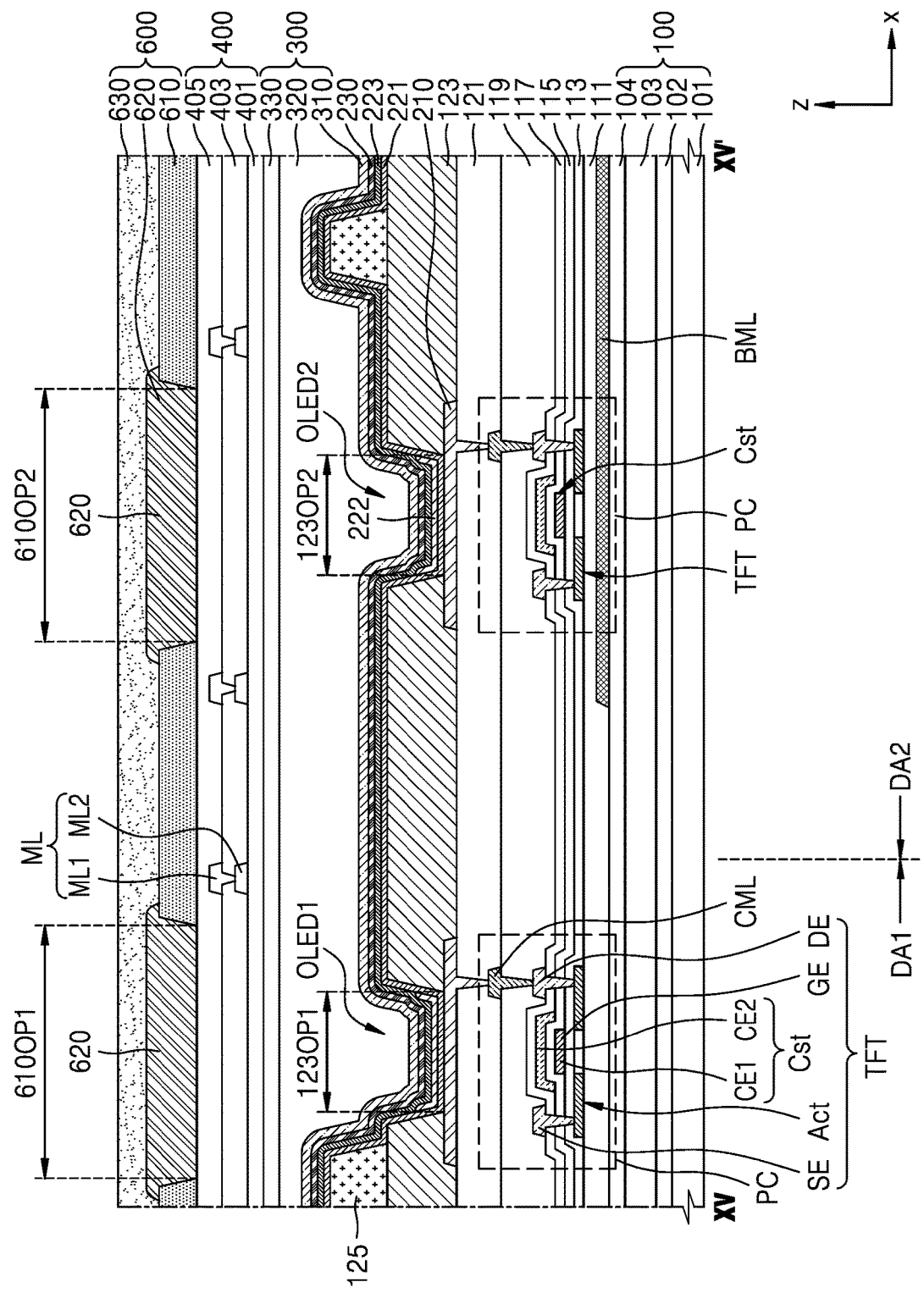
FIG. 15 is a cross-sectional view of the display panel taken along line XV-XV' of FIG. 9.

FIG. 15 is a cross-sectional view of the display panel 10 taken along line XV-XV' of FIG. 9. FIG. 15 illustrates an embodiment where the light emitting diode of the display panel 10 is an organic light emitting diode. An organic light emitting diode may be arranged in each of the first display area DA1 and the second display area DA2. For convenience of description, the organic light emitting diode arranged in the first display area DA1 will be referred to as a first organic light emitting diode OLED1, and the organic light emitting diode arranged in the second display area DA2 will be referred to as a second organic light emitting diode OLED2.

Referring to FIG. 15, a first organic light emitting diode OLED1 and a second organic light emitting diode OLED2 may be disposed or formed over a substrate 100.

In an embodiment, the substrate 100 may include a first base layer 101, a first barrier layer 102, a second base layer 103, and a second barrier layer 104. Each of the first base layer 101 and the second base layer 103 may include a polymer resin, and each of the first barrier layer 102 and the second barrier layer 104 may include an inorganic insulating material. In such an embodiment, the polymer resin may include polyether sulfone, polyacrylate, polyether imide, polyethylene naphthalate, polyethylene terephthalate, polyphenylene sulfide, polyarylate, polyimide, polycarbonate, and/or cellulose acetate propionate.

A buffer layer 111 may be disposed or arranged over the substrate 100. The buffer layer 111 may reduce or block the penetration of foreign materials, moisture, or external air from the bottom of the substrate 100. The buffer layer 111 may include an inorganic insulating material such as silicon oxide, silicon oxynitride, or silicon nitride and may have or be formed in a single-layer or multilayer structure, each layer including at least one selected from the above-listed materials.

The bottom metal layer BML may be disposed or arranged between the substrate 100 and the buffer layer 111 and may be located in the second display area DA2. The bottom metal layer BML may prevent the light, which propagates to the component 20 (see FIG. 3) arranged in the second display area DA2 or is emitted from the component 20, from affecting an electronic element such as the thin film transistor TFT of the pixel circuit PC. The bottom metal layer BML may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

Each of the first organic light emitting diode OLED1 and the second organic light emitting diode OLED2 may be electrically connected to a corresponding pixel circuit PC. The first organic light emitting diode OLED1 may be electrically connected to the pixel circuit PC between the substrate 100 and the first organic light emitting diode OLED1, and the second organic light emitting diode OLED2 may be electrically connected to the pixel circuit PC between the substrate 100 and the second organic light emitting diode OLED2.

The pixel circuit PC may include a thin film transistor TFT and a storage capacitor Cst. The thin film transistor TFT may include a semiconductor layer Act, a gate electrode GE overlapping a channel area of the semiconductor layer Act, and a source electrode SE and a drain electrode DE respectively connected to a source area and a drain area of the semiconductor layer Act. A gate insulating layer 113 may be disposed between the semiconductor layer Act and the gate electrode GE, and a first interlayer insulating layer 115 and a second interlayer insulating layer 117 may be disposed between the gate electrode GE and the source electrode SE or between the gate electrode GE and the drain electrode DE.

The storage capacitor Cst may be disposed or arranged to overlap the thin film transistor TFT. The storage capacitor Cst may include a lower electrode CE1 and an upper electrode CE2 overlapping each other. The gate electrode GE of the thin film transistor TFT may function as the lower electrode CE1 of the storage capacitor Cst. A first interlayer insulating layer 115 may be disposed between the lower electrode CE1 and the upper electrode CE2.

In an embodiment, the semiconductor layer Act may include polysilicon. Alternatively, the semiconductor layer Act may include amorphous silicon. Alternatively, the semiconductor layer Act may include an oxide semiconductor, e.g., at least one selected from oxides of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel area, and a source area and a drain area that are doped with dopants.

The gate insulating layer 113 may include an inorganic insulating material such as silicon oxide, silicon oxynitride, or silicon nitride and may have a single-layer or multilayer structure, each layer including at least one selected from the above-listed materials.

The gate electrode GE or the lower electrode CE1 may include a low-resistance conductive material such as molybdenum (Mo), aluminum (Al), copper (Cu), and/or titanium (Ti) and may have a single-layer or multilayer structure, each layer including at least one selected from the above-listed materials.

The first interlayer insulating layer 115 may include an inorganic insulating material such as silicon oxide, silicon oxynitride, and/or silicon nitride and may have a single-layer or multilayer structure, each layer including at least one selected from the above-listed materials.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layer or multilayer structure, each layer including at least one selected from the above-listed materials.

The second interlayer insulating layer 117 may include an inorganic insulating material such as silicon oxide, silicon oxynitride, and/or silicon nitride, and may have a single-layer or multilayer structure, each layer including at least one selected from the above-listed materials.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layer or multilayer structure, each layer including at least one selected from the above-listed materials. In one embodiment, for example, the source electrode SE and/or the drain electrode DE may have a three-layer structure of titanium layer/aluminum layer/titanium layer.

A first organic insulating layer 119 may be located over the thin film transistor TFT, and the thin film transistor TFT may be electrically connected to a pixel electrode 210 of the corresponding organic light emitting diode through a connection electrode layer CML disposed over the first organic insulating layer 119. The connection electrode layer CML may be connected to the thin film transistor TFT through a contact hole defined in the first organic insulating layer 119, and the pixel electrode 210 may be connected to the connection electrode layer CML through a contact hole defined in a second organic insulating layer 121.

The first organic insulating layer 119 and/or the second organic insulating layer 121 may include an organic insulating material such as acryl, benzocyclobutene ("BCB"), polyimide, and/or hexamethyldisiloxane ("HMDSO"). Alternatively, the connection electrode layer CML and the second organic insulating layer 121 may be omitted, and in such an embodiment, the pixel electrode 210 may be connected directly to the thin film transistor TFT through the contact hole defined in the first organic insulating layer 119.

Each of the first organic light emitting diode OLED1 and the second organic light emitting diode OLED2 may include a stack structure of a pixel electrode 210, an emission layer 222, and an opposite electrode 230. The stack structure may include a first functional layer 221 between the pixel electrode 210 and the emission layer 222 or may include a second functional layer 223 between the emission layer 222 and the opposite electrode 230.

The pixel electrode 210 may be disposed over the second organic insulating layer 121. The pixel electrode 210 may include a reflection layer including silver (Ag), magnesium (Mg), aluminum (Al), platinum (Pt), palladium (Pd), gold (Au), nickel (Ni), neodymium (Nd), iridium (Ir), chromium (Cr), and/or any compound thereof. The pixel electrode 210 may include a reflection layer including the above material, and a transparent conductive layer arranged over and/or under the reflection layer. The transparent conductive layer may include indium tin oxide ("ITO"), indium zinc oxide ("IZO"), zinc oxide (ZnO), indium oxide ($In_2O_3$), indium gallium oxide ("IGO"), and/or aluminum zinc oxide ("AZO"). In one embodiment, for example, the pixel electrode 210 may have a three-layer structure of ITO layer/Ag layer/ITO layer.

A pixel definition layer 123 may cover the edge of the pixel electrode 210 and an opening may be defined through the pixel definition layer 123 to overlap the pixel electrode 210. In such an embodiment, as illustrated in FIG. 15, a first opening 123OP1 overlapping the pixel electrode 210 of the first organic light emitting diode OLED1 and a second opening 123OP2 overlapping the pixel electrode 210 of the second organic light emitting diode OLED2 may be defined through the pixel definition layer 123.

The pixel definition layer 123 may include a black dye/pigment. In one embodiment, for example, the pixel definition layer 123 may include a cardo-based binder resin and a pigment. In such an embodiment, a mixture of a lactam black pigment and a blue pigment may be used as the pigment. Alternatively, the pixel definition layer 123 may include a carbon black.

The first opening 123OP1 of the pixel definition layer 123 may define an emission area of the first organic light emitting diode OLED1, and the second opening 123OP2 of the pixel definition layer 123 may define an emission area of the second organic light emitting diode OLED2. In one embodiment, for example, the width of the first opening 123OP1 of the pixel definition layer 123 may correspond to the width of the emission area of the first organic light emitting diode OLED1, and the width of the second opening 123OP2 of the pixel definition layer 123 may correspond to the width of the emission area of the second organic light emitting diode OLED2.

The pixel definition layer 123 may include, for example, an organic material such as polyimide or HMDSO. The pixel definition layer 123 may include a photosensitive material.

A spacer 125 may be disposed over the pixel definition layer 123. The spacer 125 may include a different material than the pixel definition layer 123. In one embodiment, for example, the pixel definition layer 123 and the spacer 125 may include different materials from each other (e.g., the pixel definition layer 123 may include a negative photosensitive material and the spacer 125 may include a positive photosensitive material) and may be respectively formed through separate mask processes.

The spacer 125 may include a black dye/pigment. In one embodiment, for example, the spacer 125 may include a cardo-based binder resin and a pigment. In such an embodiment, a mixture of a lactam black pigment and a blue pigment may be used as the pigment. Alternatively, the spacer 125 may include a carbon black.

The emission layer 222 may be located corresponding to or disposed in each of the first opening 123OP1 and the second opening 123OP2 of the pixel definition layer 123 and may overlap the pixel electrodes 210. The emission layer 222 may include a high-molecular or low-molecular weight organic material for emitting light of a certain color. A first functional layer 221 and a second functional layer 223 may be disposed or formed under and over the emission layer 222 respectively.

The first functional layer 221 may include a hole transport layer ("HTL") and/or a hole injection layer ("HIL"). The second functional layer 223 may include an electron transport layer ("ETL") and/or an electron injection layer ("EIL"). Unlike the emission layer 222, the first functional layer 221 and/or the second functional layer 223 may be entirely formed over the substrate 100. In such an embodiment, the first functional layer 221 and/or the second functional layer 223 may cover the first display area DA1 and the second display area DA2. In one embodiment, for example, the first functional layer 221 and/or the second functional layer 223 may be integrally formed as a single body across the first display area DA1 and the second display area DA2.

An encapsulation layer 300 may cover the first organic light emitting diode OLED1 and the second organic light emitting diode OLED2. In an embodiment, the encapsulation layer 300 may include a first inorganic encapsulation layer 310 and a second inorganic encapsulation layer 330 and an organic encapsulation layer 320 therebetween.

Each of the first inorganic encapsulation layer 310 and the second inorganic encapsulation layer 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. The polymer-based material may include acryl-based resin, epoxy-based resin, polyimide, polyethylene, and/or the like. In one embodiment, for example, the organic encapsulation layer 320 may include acryl-based resin such as polymethylmethacrylate and/or polyacrylic acid. The organic encapsulation layer 320 may be formed by curing a monomer or applying a polymer.

An input sensing layer 400 may include a touch electrode, and the touch electrode may include a metal line ML. The touch electrode may include a metal line ML having a mesh structure surrounding the emission area of the first organic light emitting diode OLED1 and the second organic light emitting diode OLED2 in the plan view. The metal line ML may include a connection structure of a first metal layer ML1 and a second metal layer ML2 as illustrated in FIG. 15. Alternatively, the metal line ML may include any one of the first metal layer ML1 and the second metal layer ML2. The metal line ML may include molybdenum (Mo), mendelevium (Md), silver (Ag), titanium (Ti), copper (Cu), aluminum (Al), and/or any alloy thereof. The electrode of the input sensing layer 400, for example, the metal line ML, may be covered by a light blocking layer 610.

The input sensing layer 400 may include a first touch insulating layer 401 over the encapsulation layer 300, a second touch insulating layer 403 over the first touch insulating layer 401, and a third touch insulating layer 405 over the second touch insulating layer 403. The first metal layer ML1 may be disposed between the first touch insulating layer 401 and the second touch insulating layer 403, and the second metal layer ML2 may be disposed between the second touch insulating layer 403 and the third touch insulating layers 405.

The first touch insulating layer 401 to the third touch insulating layer 405 may include an inorganic insulating material and/or an organic insulating material. In an embodiment, the first touch insulating layer 401 and the second touch insulating layer 403 may include an inorganic insulating material, and the third touch insulating layer 405 may include an organic insulating material.

in an embodiment, openings may be defined through the light blocking layer 610 of an anti-reflection layer 600 to overlap the emission areas of the first organic light emitting diode OLED1 and the second organic light emitting diode OLED2. FIG. 15 illustrates an embodiment where a fourth opening 610OP1 overlapping the emission area of the first organic light emitting diode OLED1 and/or the first opening 123OP1 of the pixel definition layer 123 and a fifth opening 610OP2 overlapping the emission area of the second organic light emitting diode OLED2 and/or the second opening 123OP2 of the pixel definition layer 123 are defined.

The width of the fourth opening 610OP1 of the light blocking layer 610 may be equal to or greater than the width of the emission area of the first organic light emitting diode OLED1 and/or the first opening 123OP1 of the pixel definition layer 123. FIG. 15 illustrates an embodiment the width of the fourth opening 610OP1 of the light blocking layer 610 is greater than the width of the emission area of the first organic light emitting diode OLED1 and/or the first opening 123OP1 of the pixel definition layer 123. In such an embodiment, the light reaching the naked eyes of the user forming an acute angle with respect to the upper surface of the anti-reflection layer 600 may be sufficiently secured, and thus the side visibility of the display panel 10 may be increased.

In an embodiment, the width of the fifth opening 610OP2 of the light blocking layer 610 may be equal to or greater than the width of the emission area of the second organic light emitting diode OLED2 and/or the second opening 123OP2 of the pixel definition layer 123. FIG. 15 illustrates an embodiment where the width of the fifth opening 610OP2 of the light blocking layer 610 is greater than the width of the emission area of the second organic light emitting diode OLED2 and/or the second opening 123OP2 of the pixel definition layer 123.

Color filters 620 may be respectively disposed in the fourth opening 610OP1 and the fifth opening 610OP2 of the light blocking layer 610. Each of the color filters 620 may transmit light of a wavelength band to which the wavelength of light emitted from the light emitting diode arranged thereunder belongs. In one embodiment, for example, as illustrated in FIG. 15, one of the first organic light emitting diodes OLED1 of the first display area DA1 emits green light, and the color filter 620 in the fourth opening 610OP1 to overlap the first organic light emitting diode OLED1 described above may be a green color filter. In such an embodiment, as illustrated in FIG. 15, one of the second organic light emitting diodes OLED2 of the second display area DA2 emits blue light, and the color filter 620 in the fifth opening 610OP2 to overlap the second organic light emitting diode OLED2 described above may be a blue color filter.

An overcoat layer 630 may be disposed over the light blocking layer 610 and the color filter 620. The overcoat layer 630 may be a transparent layer not having a color of a visible light band and may planarize the upper surface of the light blocking layer 610 and the upper surface of the color filter 620. The overcoat layer 630 may include a transparent organic material such as an acryl-based resin.

Figure 16:
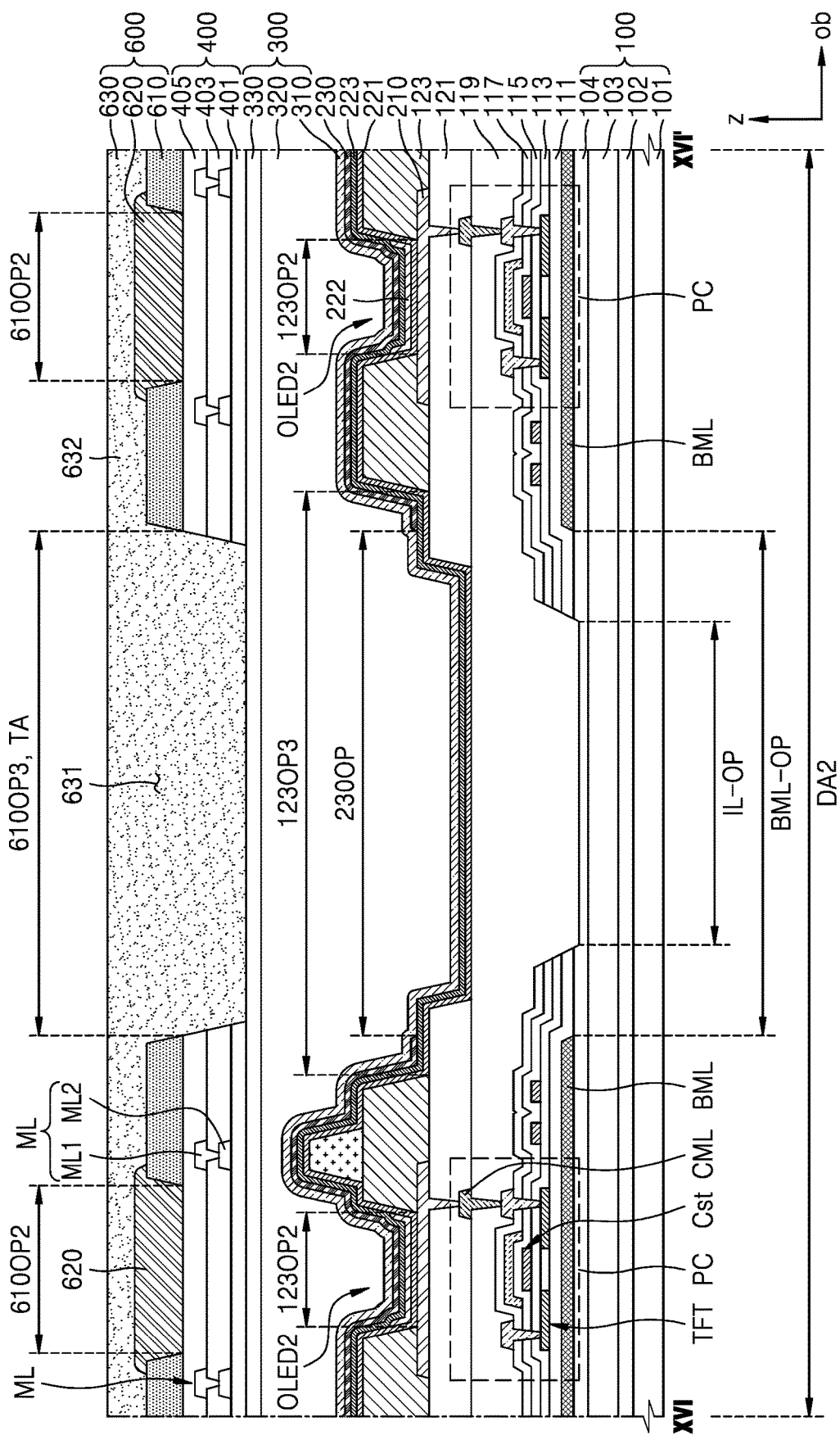
FIG. 16 is a cross-sectional view of the display panel taken along line XVI-XVI' of FIG. 9.

FIG. 16 is a cross-sectional view of the display panel 10 taken along line XVI-XVI' of FIG. 9. A direction ob indicates a direction between the x-axis direction and y-axis direction. In an embodiment, as illustrated in FIG. 16, a transmission area TA may be defined between two adjacent second organic light emitting diodes OLED2 among a plurality of second organic light emitting diodes OLED2 in the second display area DA2. Each of the second organic light emitting diodes OLED2 may be electrically connected to a corresponding pixel circuit PC. The pixel circuit PC over the substrate 100 may include a thin film transistor TFT and a storage capacitor Cst, and the second organic light emitting diode OLED2 may have a stack structure of a pixel electrode 210, an emission layer 222, and an opposite electrode 230 and may be covered by an encapsulation layer 300. In such an embodiment, as described above, an input sensing layer 400 and an anti-reflection layer 600 may be disposed over the encapsulation layer 300.

In an embodiment, a third opening 123OP3 corresponding to the transmission area TA may be defined through the pixel definition layer 123, and a sixth opening 610OP3 corresponding to the transmission area TA may be defined through the light blocking layer 610. A portion of the overcoat layer 630 may be disposed in the sixth opening 610OP3. In one embodiment, for example, a first portion 631 of the overcoat layer 630 may at least partially fill the sixth opening 610OP3, and a second portion 632 integrally formed with the first portion 631 as a single body may entirely cover the light blocking layer 610 and the color filters 620. The sixth opening 610OP3 may overlap the third opening 123OP3.

In an embodiment, as illustrated in FIG. 16, an opening corresponding to the transmission area TA may be defined through a portion of the second organic insulating layer 121 located over the first organic insulating layer 119. In an embodiment, an opening corresponding to the transmission area TA may be defined through the first touch insulating layer 401, the second touch insulating layer 403, and the third touch insulating layer 405 included in the input sensing layer 400. In such an embodiment, the overcoat layer 630 may fill the opening of the first touch insulating layer 401, the second touch insulating layer 403, and the third touch insulating layer 405.

In an embodiment, as illustrated in FIG. 16, the transmission area TA may be defined by a second opening portion BML-OP of the bottom metal layer BML. The second organic light emitting diodes OLED2 as the second display devices may include an opposite electrode 230 that is integrally formed as a single body in the second organic light emitting diodes OLED2, and a first opening portion 230OP corresponding to the transmission area TA is defined through the opposite electrode 230. Accordingly, the transmittance in the transmission area TA may be increased. In a manufacturing process, the first opening portion 230OP may be formed by removing a portion of the opposite electrode 230 by irradiating a laser beam through the substrate 100. In such a process, the bottom metal layer BML may prevent the laser beam from being irradiated to the pixel circuit PC and the second organic light emitting diode OLED2. Accordingly, the first opening portion 230OP of the opposite electrode 230 may be formed to correspond to the second opening portion BML-OP of the bottom metal layer BML. In such an embodiment, a second opening portion BML-OP may be defined through the bottom metal layer BML to overlap the first opening portion 230OP of the opposite electrode 230 when viewed from the direction perpendicular to the substrate 100. As a result, the opposite electrode 230 may have a shape corresponding to the bottom metal layer BML, that is, an overlapping shape, in the second display area DA2 when viewed from the direction perpendicular to the substrate 100.

In an embodiment, as described above with reference to FIG. 9 or the like, a transmission area TA may be disposed between the pixel groups PG in the second display area DA2. The transmission area TA may not exist between the first display area DA1 and the bottom metal layer BML, that is, the transmission area TA may not be defined between the first display area DA1 and the bottom metal layer BML. In such an embodiment, the opposite electrode 230 may not be removed between the first display area DA1 and the bottom metal layer BML. That is, the transmission area TA may not exist between the first display area DA1 and the bottom metal layer BML, and the laser beam may not be irradiated to the corresponding portion. Accordingly, the opposite electrode 230 may be integrally formed as a single body across the first display area DA1 and the second display area DA2. As a result, in such an embodiment of the display panel 10, the opposite electrode 230 may have a shape with first opening portions 230OP corresponding to the transmission areas TA illustrated in FIG. 8. In an embodiment, the first functional layer 221 and the second functional layer 223 may transmit the laser beam, and in such an embodiment, the first functional layer 221 and the second functional layer 223 may also exist in the portion corresponding to the transmission areas TA.

In an embodiment, the number of pixels per unit area arranged in the first display area DA1 may be greater than the number of pixels per unit area displayed in the second display area DA2. In such an embodiment, some of the scan lines connected to the pixels located in the portion of the first display area DA1 located on one side (the −x direction) of the second display area DA2 may extend to the portion of the first display area DA1 located on the other side (the +x direction) of the second display area DA2 without being connected to the pixels in the second display area DA2 and thus may be connected to the pixels located in the portion of the first display area DA1 located on the other side (the +x direction) of the second display area DA2.

Such scan lines may extend along the edge of the second display area DA2 as indicated by a reference numeral S5 in FIGS. 9 and 11 and may be located over the bottom metal layer BML and may extend substantially in the x-axis direction along the bottom metal layer BML as indicated by a reference numeral S6 in FIGS. 9 and 11. In such an embodiment, as described above with reference to FIGS. 10 and 12, such scan lines S5 and S6 (see FIGS. 9 and 11) may include a scan line extending from the first display area DA1 into the second display area DA2 substantially in the +x direction, a sub scan line located in the second display area DA2, a scan line extending from the first display area DA1 into the second display area DA2 substantially in the −x direction, and bridge lines for connecting the scan lines to the sub scan line.

In an embodiment, an opening may be defined through some insulating layers (e.g., inorganic insulating layers) among the insulating layers arranged under the pixel electrode 210 to correspond to the transmission area TA. In one embodiment, for example, a stack structure of the second barrier layer 104, the buffer layer 111, the gate insulating layer 113, the first interlayer insulating layer 115, and the second interlayer insulating layer 117 may include an inorganic insulating material, and a seventh opening IL-OP may be defined through the stack structure to correspond to the transmission area TA. A portion of the first organic insulating layer 119 disposed over the stack structure may exist in the seventh opening IL-OP.

Figure 17:
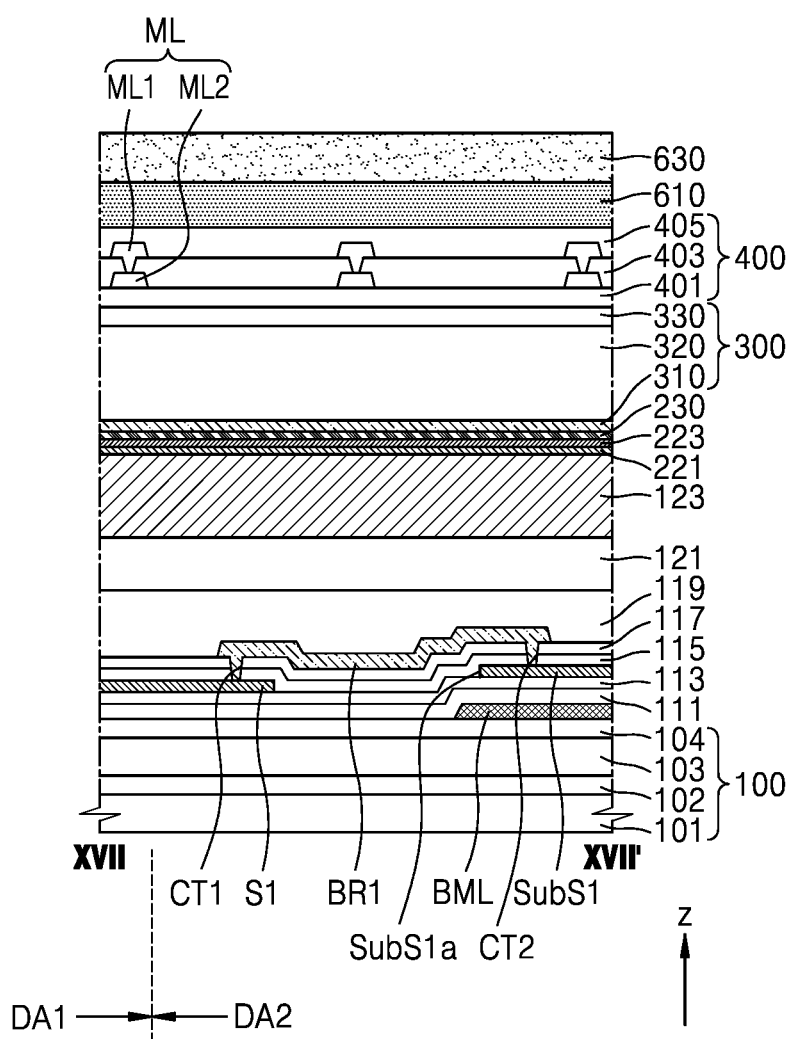
FIG. 17 is a cross-sectional view of the display panel taken along line XVII-XVII' of FIG. 10.

FIG. 17 is a cross-sectional view of the display panel 10 taken along line XVII-XVII' of FIG. 10. In an embodiment, as illustrated in FIG. 17, the first scan line S1 and the first sub scan line SubS1 may be disposed in a same layer as the gate electrode GE (see FIG. 15). In such an embodiment, the first scan line S1 and the first sub scan line SubS1 may be simultaneously formed with (or formed during a same process) the gate electrode GE using a same material as the gate electrode GE. FIG. 17 illustrates an embodiment where the first scan line S1 and the first sub scan line SubS1 are located over the gate insulating layer 113 like the gate electrode GE. The first bridge line BR1 may be disposed in a same layer as the source electrode SE and the drain electrode DE. In such an embodiment, the first bridge line BR1 may be simultaneously formed with the drain electrode DE using a same material as the source electrode SE and the drain electrode DE. FIG. 17 illustrates an embodiment where the first bridge line BR1 is disposed over the second interlayer insulating layer 117 like the source electrode SE and the drain electrode DE.

The first bridge line BR1 may be disposed over the first scan line S1 and the first sub scan line SubS1. In such an embodiment, the distance between the first scan line S1 and the substrate 100 and the distance between the first sub scan line SubS1 and the substrate 100 may be less than the distance between the first bridge line BR1 and the substrate 100.

In such an embodiment, the second scan line S2 and the second bridge line BR2 or the like may have a same cross-sectional structure as the first scan line S1 and the first bridge line BR1 described above with reference to the cross-sectional views. In such an embodiment, the third scan line S3, the second sub scan line SubS2, and the third bridge line BR3 or the like may have a same cross-sectional structure as the first scan line S1, the first sub scan line SubS1, and the first bridge line BR1 described above with reference to the cross-sectional views.

Figure 18:
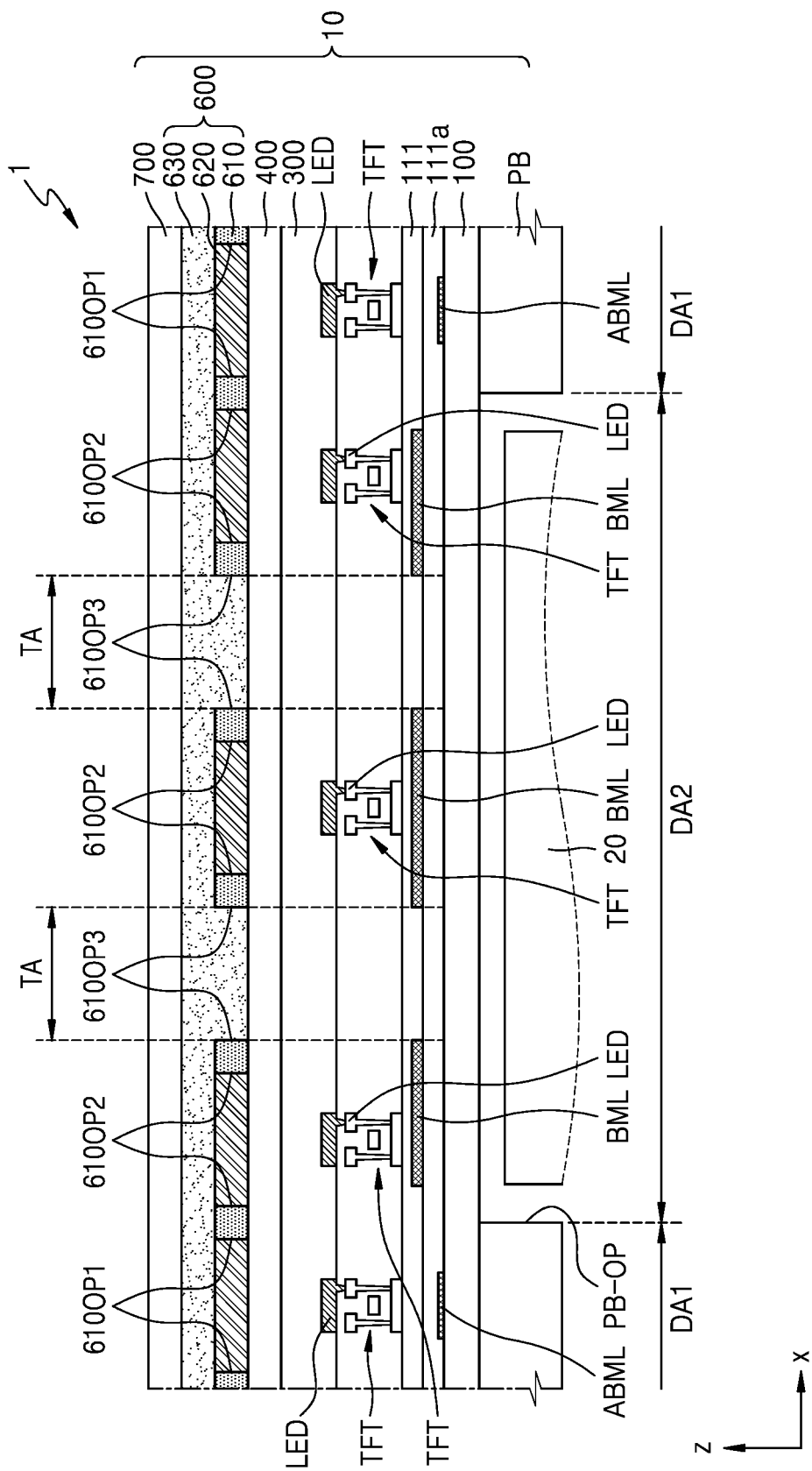
FIG. 18 is a cross-sectional view schematically illustrating a portion of a display panel and an electronic apparatus including the display panel according to an alternative embodiment.

FIG. 18 is a cross-sectional view schematically illustrating a portion of a display panel 10 and an electronic apparatus 1 including the display panel 10 according to an alternative embodiment. In an embodiment, as illustrated in FIG. 18, the display panel 10 may further include an additional bottom metal layer ABML disposed between the first display device and the substrate 100 in the first display area DA1. In such an embodiment, the thickness of the bottom metal layer BML may be greater than the thickness of the additional bottom metal layer ABML. In such an embodiment, the bottom metal layer BML may be sufficiently thick to effectively shield the laser beam in the process of forming the first opening portion 230OP of the opposite electrode 230 as described above. In one embodiment, for example, the bottom metal layer BML may have a thickness of about 2500 angstrom (Å).

The additional bottom metal layer ABML may correspond to a driving thin film transistor among the thin film transistors included in the pixel circuit PC. In such an embodiment, if the additional bottom metal layer ABML is excessively thick, a crack may be formed in the semiconductor layer in the process of forming the semiconductor layer included in the thin film transistors. Therefore, in such an embodiment, the additional bottom metal layer ABML may have a thinner structure than the bottom metal layer BML. In one embodiment, for example, the additional bottom metal layer ABML may have a thickness of about 1000 Å.

In an embodiment, the additional bottom metal layer ABML and the bottom metal layer BML may include a same material as each other. In an embodiment, the distance between the bottom metal layer BML and the substrate 100 may be greater than the distance between the additional bottom metal layer ABML and the substrate 100. In such an embodiment, an insulating layer such as an additional buffer layer 111a may be arranged between the additional bottom metal layer ABML and the bottom metal layer BML. The additional buffer layer 111a may include a same material as the buffer layer 111.

Figure 19:
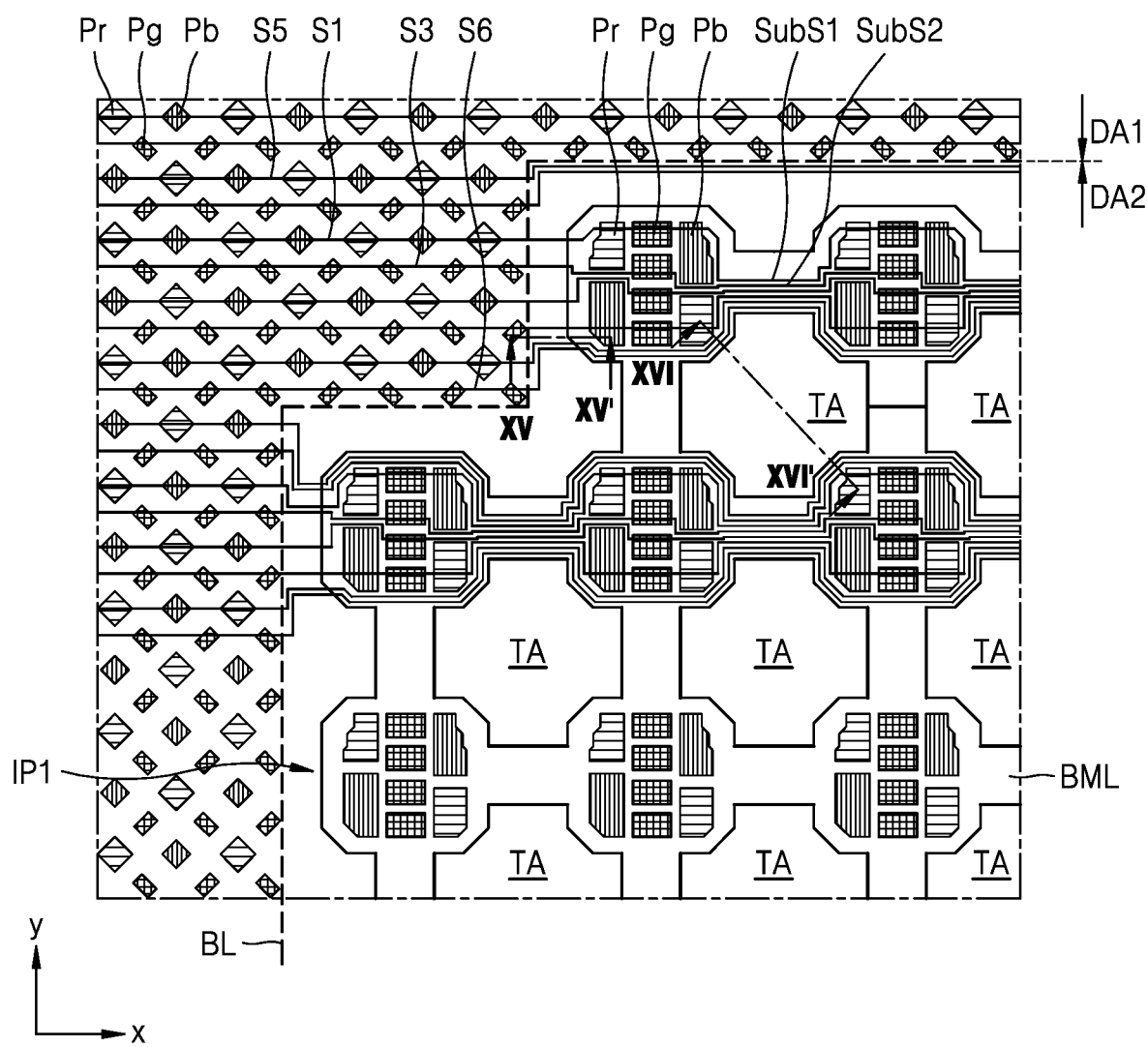
FIG. 19 is a plan view schematically illustrating a portion of a first display area and a second display area of a display panel according to another alternative embodiment.

FIG. 19 is a plan view schematically illustrating a portion of a first display area DA1 and a second display area DA2 of a display panel 10 according to another alternative embodiment. In such an embodiment, as described above with reference to FIGS. 13, 14, or the like, the bottom metal layer BML may include a first indent portion IP1, a second indent portion IP2, a third indent portion IP3, and/or a fourth indent portion IP4. In an embodiment of the display panel 10 according to the invention, the area of the bottom metal layer BML may be reduced to correspond to the outer shape of the pixel group PG in the second display area DA2. Accordingly, the first scan line S1, the second scan line S2, the third scan line S3, and/or the fourth scan line S4 may not overlap the bottom metal layer BML when viewed from the direction perpendicular to the substrate 100.

In embodiments of the invention, as described herein, a pixel defect in a display area of the display panel may be effectively prevented or minimized, and an electronic apparatus including the display panel may be implemented. However, the scope of the disclosure is not limited to these effects.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. An electronic apparatus comprising:
a substrate, on which a first display area and a second display area are defined, wherein the second display area is at least partially surrounded by the first display area and includes a sub display area and a transmission area;
first light-emitting diodes disposed on the substrate in the first display area;
second light-emitting diodes disposed on the substrate in the sub display area of the second display area;
a first scan line extending from the first display area into the second display area across one side of the second display area;
a first sub scan line disposed in the second display area and including a first end;
a first bridge line electrically connecting the first scan line to the first sub scan line; and
a bottom metal layer disposed between the second light-emitting diodes and the substrate in the second display area, wherein the bottom metal layer does not overlap the first scan line when viewed from a direction perpendicular to the substrate.

2. The electronic apparatus of claim 1, wherein, when viewed from the direction perpendicular to the substrate, the bottom metal layer overlaps a portion of the first bridge line where the first end of the first sub scan line and the first bridge line overlap each other.

3. The electronic apparatus of claim 1, wherein
when viewed from the direction perpendicular to the substrate, the bottom metal layer includes a first indent portion indented inward, and
the first scan line and the first bridge line contact each other in the first indent portion.

4. The electronic apparatus of claim 1, wherein a distance between the first scan line and the substrate and a distance between the first sub scan line and the substrate are less than a distance between the first bridge line and the substrate.

5. The electronic apparatus of claim 1, wherein, when viewed from the direction perpendicular to the substrate, the first scan line passes some of the first light-emitting diodes and the first sub scan line passes the second light-emitting diodes.

6. The electronic apparatus of claim 1, further comprising:
a second scan line extending from the first display area into the second display area across another side of the second display area; and
a second bridge line electrically connecting the second scan line to the first sub scan line,
wherein the bottom metal layer does not overlap the second scan line when viewed from the direction perpendicular to the substrate.

7. The electronic apparatus of claim 6, wherein, when viewed from the direction perpendicular to the substrate, the bottom metal layer overlaps a portion of the second bridge line where a second end of the first sub scan line and the second bridge line overlap each other.

8. The electronic apparatus of claim 6, wherein
when viewed from the direction perpendicular to the substrate, the bottom metal layer includes a second indent portion indented inward, and
the second scan line and the second bridge line contact each other in the second indent portion.

9. The electronic apparatus of claim 6, wherein a distance between the second scan line and the substrate is less than a distance between the second bridge line and the substrate.

10. The electronic apparatus of claim 6, wherein, when viewed from the direction perpendicular to the substrate, the first scan line passes some of the first light-emitting diodes, the second scan line passes some others of the first light-emitting diodes, and the first sub scan line passes the second light-emitting diodes.

11. The electronic apparatus of claim 1, further comprising:
a third scan line extending from the first display area into the second display area across the one side of the second display area;
a second sub scan line disposed in the second display area and including a third end; and
a third bridge line electrically connecting the third scan line to the second sub scan line,
wherein the bottom metal layer does not overlap the third scan line when viewed from the direction perpendicular to the substrate.

12. The electronic apparatus of claim 11, wherein, when viewed from the direction perpendicular to the substrate, the bottom metal layer overlaps a portion of the third bridge line where the third end of the second sub scan line and the third bridge line overlap each other.

13. The electronic apparatus of claim 11, wherein
when viewed from the direction perpendicular to the substrate, the bottom metal layer includes a third indent portion indented inward, and
the third scan line and the third bridge line contact each other in the third indent portion.

14. The electronic apparatus of claim 11, wherein a distance between the third scan line and the substrate and a distance between the second sub scan line and the substrate is less than a distance between the third bridge line and the substrate.

15. The electronic apparatus of claim 1, wherein the first sub scan line overlaps the bottom metal layer when viewed from the direction perpendicular to the substrate.

16. The electronic apparatus of claim 1, wherein the first scan line and the first sub scan line are disposed in a same layer as each other.

17. The electronic apparatus of claim 1, wherein
the second light-emitting diodes share an opposite electrode which is integrally formed as a single body, wherein a first opening portion is defined through the opposite electrode to correspond to the transmission area, and
a second opening portion is defined through the bottom metal layer to overlap the first opening portion of the opposite electrode when viewed from the direction perpendicular to the substrate.

18. The electronic apparatus of claim 1, further comprising an additional bottom metal layer disposed between the first light-emitting diodes and the substrate in the first display area.

19. The electronic apparatus of claim 18, wherein a distance between the bottom metal layer and the substrate is greater than a distance between the additional bottom metal layer and the substrate.

20. An electronic apparatus comprising:
a display panel including a first display area and a second display area, wherein the second display area is at least partially surrounded by the first display area and includes a sub display area and a transmission area; and a component disposed under the display panel to overlap the second display area,
wherein the display panel comprises:
first light-emitting diodes disposed in the first display area;
second light-emitting diodes disposed in the sub display area of the second display area;
a first scan line extending from the first display area into the second display area across one side of the second display area;
a first sub scan line disposed in the second display area;
a first bridge line electrically connecting the first scan line to the first sub scan line; and
a bottom metal layer disposed between the second light-emitting diodes and a substrate of the display panel in the second display area, wherein the bottom metal layer does not overlap the first scan line when viewed from a direction perpendicular to the substrate.

* * * * *